United States Patent
Bishop et al.

(10) Patent No.: US 11,550,003 B2
(45) Date of Patent: Jan. 10, 2023

(54) CASIMIR-ENABLED SENSING SYSTEM AND METHOD

(71) Applicant: Trustees of Boston University, Boston, MA (US)

(72) Inventors: David J. Bishop, Brookline, MA (US); Joshua Javor, Cambridge, MA (US); David K. Campbell, Brookline, MA (US); Matthias Imboden, St. Blaise (CH)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 17/692,633

(22) Filed: Mar. 11, 2022

(65) Prior Publication Data

US 2022/0291299 A1    Sep. 15, 2022

Related U.S. Application Data

(60) Provisional application No. 63/300,907, filed on Jan. 19, 2022, provisional application No. 63/300,858, (Continued)

(51) Int. Cl.
*G01R 33/022* (2006.01)

(52) U.S. Cl.
CPC .................. *G01R 33/022* (2013.01)

(58) Field of Classification Search
CPC ............ G01R 33/00; G01R 33/0035; G01R 33/0023; G01R 33/0017; G01R 31/3191;
(Continued)

(56) References Cited

U.S. PATENT DOCUMENTS

| 3,273,397 | A | | 9/1966 | Forward | |
|---|---|---|---|---|---|
| 4,257,001 | A | * | 3/1981 | Partain | G01N 22/00 324/636 |

(Continued)

FOREIGN PATENT DOCUMENTS

CN    113597520 A    11/2021

OTHER PUBLICATIONS

Javor, et al. "100 pT/cm single-point MEMS magnetic gradiometer from a commercial accelerometer" 2020; Microsystems & Nanoengineering; vol. 6; No. 71; 13 pages.
(Continued)

*Primary Examiner* — Jermele M Hollington
*Assistant Examiner* — Taqi R Nasir
(74) *Attorney, Agent, or Firm* — Burns & Levinson LLP; Steven M. Mills

(57) ABSTRACT

A sensing system, and method of operating same, can act as a highly sensitive gradiometer. A first non-magnetic element, such as a sphere, is driven at a first resonance frequency along an axis. A magnet is attached to a second non-magnetic element, such as a plate, and driven at a second resonance frequency along the axis. The first non-magnetic element and the second non-magnetic element are coupled by a force along the axis, in resonance. The gradiometer is configured to determine a gradient magnetic field acting on one or more of the first non-magnetic element and magnet based on change in at least one resonance characteristic.

21 Claims, 18 Drawing Sheets

Related U.S. Application Data filed on Jan. 19, 2022, provisional application No. 63/159,829, filed on Mar. 11, 2021.

(58) Field of Classification Search
CPC ...... G01R 33/022; G01B 7/004; G01C 17/38; G06F 3/017; G06F 3/0346; G06F 3/012
See application file for complete search history.

(56) References Cited

U.S. PATENT DOCUMENTS

| | | | |
|---|---|---|---|
| 4,368,430 | A | 1/1983 | Dale et al. |
| 4,700,135 | A | 10/1987 | Hoenig |
| 6,008,641 | A | 12/1999 | Penfold et al. |
| 6,054,856 | A * | 4/2000 | Garroway ............ G01R 33/343 600/407 |
| 6,084,495 | A | 7/2000 | Ripingale |
| 6,231,011 | B1 | 5/2001 | Chu et al. |
| 6,268,726 | B1 | 7/2001 | Prammer et al. |
| 6,433,543 | B1 | 8/2002 | Shahinpoor et al. |
| 6,462,540 | B1 | 10/2002 | Kandori et al. |
| 7,688,072 | B1 | 3/2010 | Wiegert et al. |
| 8,627,721 | B2 | 1/2014 | Uwechue |
| 2003/0197433 | A1 | 10/2003 | Cheung et al. |
| 2004/0119569 | A1 | 6/2004 | Norimatsu |
| 2005/0057251 | A1* | 3/2005 | Suits ....................... G01V 3/105 324/309 |
| 2007/0096729 | A1 | 5/2007 | Brunson et al. |
| 2007/0290678 | A1 | 12/2007 | Herrmann et al. |
| 2009/0293611 | A1 | 12/2009 | Van Kann et al. |
| 2010/0212676 | A1 | 8/2010 | Shapiro et al. |
| 2010/0244819 | A1 | 9/2010 | Johnson et al. |
| 2010/0279374 | A1 | 11/2010 | Sista et al. |
| 2010/0288044 | A1 | 11/2010 | Meyer |
| 2010/0295546 | A1 | 11/2010 | Walther et al. |
| 2011/0138909 | A1 | 6/2011 | Van Kann |
| 2014/0111154 | A1 | 4/2014 | Roy et al. |
| 2014/0120633 | A1 | 5/2014 | Gandini et al. |
| 2016/0084923 | A1 | 3/2016 | Bai |
| 2016/0216353 | A1 | 7/2016 | Heinen et al. |
| 2017/0176389 | A1 | 6/2017 | Paulson |
| 2017/0200815 | A1* | 7/2017 | Caldeira ............. H03K 17/687 |
| 2017/0241802 | A1 | 8/2017 | Ausserlechner |
| 2018/0210039 | A1 | 7/2018 | Shalev |
| 2019/0018164 | A1 | 1/2019 | Slocum et al. |
| 2019/0079141 | A1 | 3/2019 | Marauska et al. |
| 2019/0212299 | A1 | 7/2019 | Freear et al. |
| 2019/0242956 | A1 | 8/2019 | Przytarski et al. |
| 2019/0317167 | A1 | 10/2019 | Laborde et al. |
| 2020/0025840 | A1 | 1/2020 | Bickford |
| 2020/0049528 | A1 | 2/2020 | Ausserlechner |
| 2020/0110081 | A1 | 4/2020 | Gandini et al. |
| 2021/0199431 | A1 | 7/2021 | Barbier |

OTHER PUBLICATIONS

Javor, et al. "A Microtissue Platform to Simultaneously Actuateand Detect Mechanical Forces via Non-Contact Magnetic Approach" Feb. 2021; Journal of Microelectromechanical Systems; vol. 30; No. 1; 9 pages.

Javor, et al. "Analysis of a Casimir-driven parametric amplifierwith resilience to Casimir pull-in for MEMS single-point magnetic gradiometry" Microsystems & Nanoengineering; vol. 7; No. 73; 11 pages, 2021.

SQUID (requires cryogenic chamber): Web Page: https://www.elliotscientific.com/Tristan- Technologies-SQUID-Sensors; 2022.

Atomic Magnetometer: Web Page: https://quspin.com/products-qzfm/; 2022.

Magnetoresistive: Web Page: https://product.tdk.com/en/techlibrary/developing/bio-sensor/index.html; 2022.

Halbach Array: Web Page: https://www.stanfordmagnets.com/everything-you-need-to-know-about-halbach-arrays.html; 2022.

Magnetic Levitation: Web Page: https://www.energy.gov/articles/how-maglev-works; 2016.

Magnetic Gears: Web Page: https://www.kjmagnetics.com/blog.asp?p=magnetic-gear; 2022.

Imboden, et al. "Design of a Casimir-driven parametric amplifier" 2014; Journal of Applied Physics; vol. 116; 12 pages.

Stange, et al. "Building a Casimir metrology platform with a commercial MEMS sensor" 2019; Microsystems & Nanoengineering; vol. 5; No. 14; 9 pages.

International Search Report with Written Opinion dated Mar. 11, 2022 in International Patent Application No. PCT/US2022/019963 filed Jun. 16, 2022; 12 pages.

International Search Report with Written Opinion dated Mar. 11, 2022 in International Patent Application No. PCT/US2022/019966 filed Jun. 16, 2022; 12 pages.

International Search Report with Written Opinion dated Mar. 11, 2022 in International Patent Application No. PCT/US2022/019970 filed Jul. 7, 2022; 17 pages.

\* cited by examiner

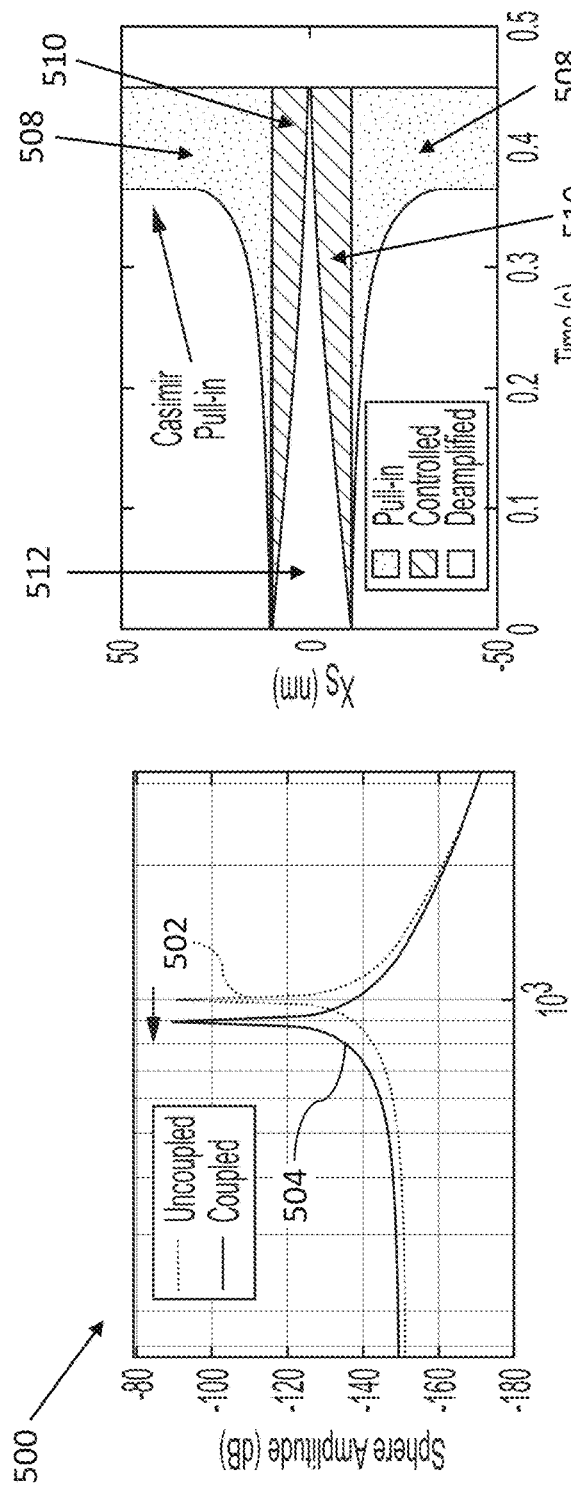
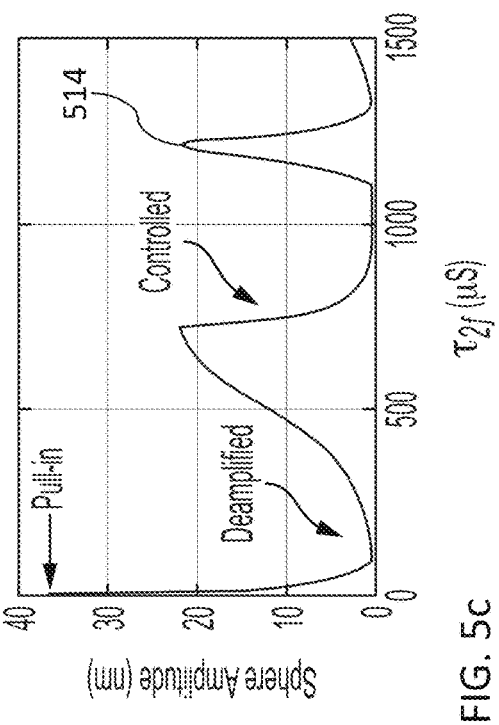
FIG. 5a
FIG. 5b
FIG. 5c

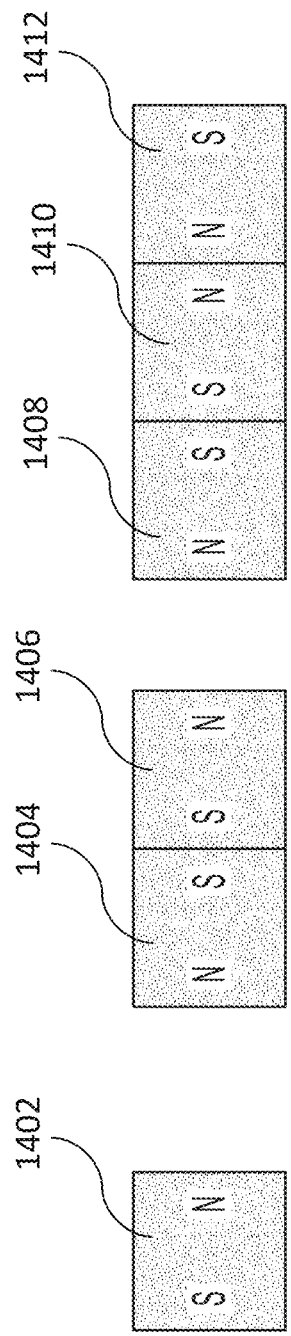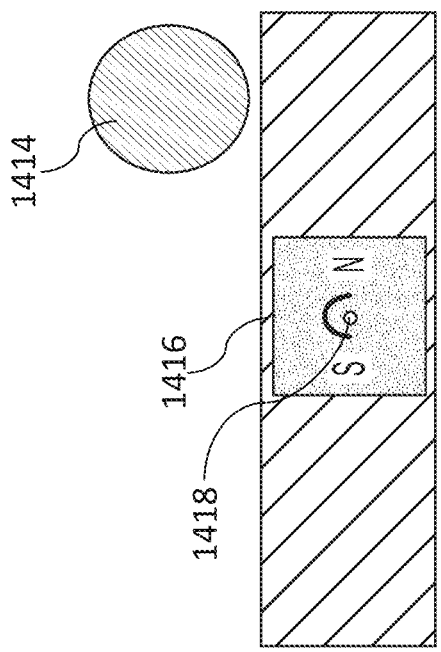
FIG. 14a
FIG. 14b
FIG. 14c
FIG. 14d

CASIMIR-ENABLED SENSING SYSTEM AND METHOD

CROSS REFERENCE TO RELATED APPLICATIONS

This Applications claims priority to and the benefit of U.S. Provisional Patent Application No. 63/159,829, filed on Mar. 11, 2021, and entitled "CASIMIR-ENABLED QUANTUM MAGNETOMETER", and U.S. Provisional Patent Application No. 63/300,858, filed Jan. 19, 2022, and entitled "HIGHER ORDER GRADIOMETERS AND USES THEREOF", and U.S. Provisional Patent Application No. 63/300,907, filed on Jan. 19, 2022, and entitled "FIRST ORDER SINGLE-POINT GRADIOMETER (FOG) AND USES THEREOF", the contents of which are incorporated herein by reference as though fully set forth herein.

FIELD OF THE TECHNOLOGY

The subject disclosure relates to sensing systems generally, and particularly to MEMS magnetometers and gradiometers.

BACKGROUND OF THE TECHNOLOGY

The measurement of low magnetic fields is a critically important area of metrology. Magnetic compasses were invented over 2000 years ago and have been widely used in navigation since the 11th century. They rival the astrolabe as the most ancient scientific instrument built by human beings. Even in the modern era, with widely available GPS navigation systems, compasses are still used to provide direction information in addition to position. Some migratory birds are thought to use a type of magnetic compass for long range navigation. Magnetotactic bacteria use magnetosomes to sense up or down in the search for the environment with the optimal oxygen concentration in the sediments in which they live.

The list of applications for modern magnetometers and gradiometers is vast including prospecting, tunnel/pipe/cable location, position and rotation sensing in mechanical systems, bio-magnetic applications such as magnetocardiography (MCG), low frequency communication systems that can penetrate sea water and deep underground, astronomy, earthquake analysis and prediction, security systems, indoor navigation, current measurements, fault detection and many others.

Quantum fluctuations in the electromagnetic field give rise to forces between conductors at the same potential, when their separation is near 100 nm. Known as the Casimir force, this phenomenon was first predicted by H. B. G. Casimir[1], and was later expanded to arbitrary materials[23]. Since then, the Casimir Force has been measured experimentally many times[4,5,6,7,8,9,10,11], and has been proposed as a practical metrology platform using micro- and nano-electromechanical systems (MEMS/NEMS)[12]. The Casimir Force is attractive for metrology applications due to its extreme sensitivity to the separation between two objects and the ability to be measured in ambient conditions. One of the most critical challenges in the development of practical platforms is the resilience to Casimir pull-in, which results in stiction in MEMS/NEMS devices and typically irreversible damage[13,14]. Casimir pull-in is an obstacle in devices which employ an attractive force, but a specific combination of materials can generate a repulsive force as well[15]. The repulsive force configuration, however, has only been observed in liquid, which is not ideal for many common MEMS/NEMS applications, such as resonant sensing. A device capable of leveraging the attractive Casimir Force while resilient to pull-in would realize great utility for quantum metrology, but practical application is challenging.

Quantum metrology has long-standing application to the measurement of very weak magnetic fields. The superconducting quantum interference device (SQUID) measures changes in magnetic field associated with a flux quantum[16]. The atomic magnetometer (AM) measures a quantum effect involving the magnetic spin states of atoms in a vapor cell[17]. The list of applications for such high-resolution magnetic sensors is vast, spanning biomagnetic detection of cardiac contractions[18,19], electromagnetic brainwaves[20], and solid cancerous tumors[21], to astronomical observations, such as Jupiter's magnetosphere[22]. Sensitive magnetometry is often challenged by interference from ambient geomagnetic field and nearby electromagnetic sources. For real-time measurements, the most common methods to reduce effects of interference are magnetic shielding and gradiometry. Shielding is both expensive and cumbersome, and so there is a great effort to conduct unshielded measurements, where gradiometry and sensor design are critical. Gradiometry involves the measurement of the gradient of the magnetic field, as opposed to the field itself, to reduce interference from nearby sources. A gradiometric measurement is typically achieved by the subtraction of two magnetometers and was recently achieved in a single-point measurement[23] at a resolution in the range of magnetocardiography (MCG). The application of gradiometric methods have been shown to reduce the need for shielded environments in sensitive measurements, such as MCG.

Referring now to FIG. 1, a graph 100 depicting an overview of existing gradiometer technology compared to the system and methods disclosed herein is shown (repurposed from reference 23). All magnetic fields are illustrated as gradients. Existing sensor technology is adjusted by taking the best resolution in literature and assuming two sensors can be separated by 1 cm, which can measure a gradient field. E is Earth's field gradient and GIVEN is the gradient geomagnetic noise. The first order gradients of the geomagnetic field (E, 500 pT/cm) and geomagnetic noise (GMN, 500 fT/cm) are illustrated by dash-dotted lines. The devices shown at the bottom are microelectromechanical systems (MEMS) technology. SQUID and AM technology clearly lead the group in resolution. MEMS magnetic sensors are typically resonant sensors with high quality factors, where impressive sensitivity has been achieved at higher frequencies in the kHz range[24,25]. In order to detect low frequency biomagnetic fields, nontrivial techniques would be necessary to employ resonant sensors. The inventors' own previous MEMS single-point gradiometer design experimentally achieved a resolution of 100 pT/cm, with a calculated best-case resolution of 30 fT/cm at resonance. The subject technology proposes a quantum-derived enhancement to this design, which suggests a 10,000 fold improvement in the best-case resolution with a measurement near DC.

The sensitivity of resonant MEMS devices can be tuned by many techniques, such as parametric amplification[26,27] and modal coupling[28,29]. Conceptually, parametric amplification is typically achieved by modulating a parameter of the equation of motion at two times the frequency of resonance and controlling the phase relation between the driven mode and the modulated parameter. When applied to the drive system of a MEMS cantilever, thermomechanical noise was reduced in one phase by 4.9 dB. A Lorentz force MEMS magnetometer was parametrically driven to enhance sensitivity at resonance by over 80 fold. The gain in such electrostatic systems is typically 10-1000. Parametric modulation can also be applied to coupled resonators, where one object, or mode, oscillates at twice the frequency of another. Parametric pumping was shown to dynamically tune the coupling of two modes in a gyroscopic ring resonator, with application in inertial sensing. In the design of a Casimir-coupled resonator, a gold sphere was used to parametrically pump the oscillation of a torsional oscillator, proposed to amplify a DC voltage measurement up to ten orders of magnitude. Using an attractive Casimir Force design, the challenge of avoiding Casimir pull-in was also discussed in depth. Tunability of such systems is often critical for experimental utility, and to account for small fabrication asymmetries, which have a significant impact on the coupling.

SUMMARY OF THE TECHNOLOGY

The system and methods disclosed herein relate to a Casimir-driven metrology platform, where a time-delay based parametric amplification technique is developed to achieve a steady state and avoid pull-in. The subject technology applies this design to the detection of weak, low frequency, gradient magnetic fields, similar to those emanating from ionic currents in the heart and brain. Parameters are selected from recent experimental platforms developed for Casimir metrology and magnetic gradiometry, both on MEMS platforms. While MEMS offer many advantages to such an application, the detected signal must typically be at the resonant frequency of the device, with diminished sensitivity in the low frequency regime of biomagnetic fields. Using a Casimir-drive parametric amplifier, we report a 10,000 fold improvement in the best-case resolution of MEMS single-point gradiometers, with a maximum sensitivity of 6 Hz/(pT/cm) at 1 Hz. The subject technology has the potential to revolutionize metrology, and specifically may enable unshielded monitoring of biomagnetic fields in ambient conditions.

In at least one aspect, the subject technology relates to a gradiometer. A first non-magnetic element is driven at a first resonance frequency along an axis. A magnet is attached to a second non-magnetic element and driven at a second resonance frequency along the axis. The first non-magnetic element and the second non-magnetic element are coupled by a force along the axis, in resonance. The gradiometer is configured to determine a gradient magnetic field acting on one or more of the first non-magnetic element and magnet based on change in at least one resonance characteristic.

In some embodiments, the first non-magnetic element is a sphere, the second non-magnetic element is a plate, and the plate has an attractive force to the sphere. The first non-magnetic element can be coupled to a transducer platform and the second non-magnetic element and the plate can be coupled to a second force transducer platform. In some embodiments, the second resonance frequency is twice the first resonance frequency. In some embodiments, the force can be a Casimir force. In other cases the force is an electrostatic force. The at least one resonance characteristic can be a change in frequency, a change in amplitude, or a change in phase.

In some embodiments, the magnet is a first magnet, and the gradiometer further comprises a second magnet, the first magnet and the second magnet being positioned such that a pair of like magnetic poles of the first magnet and the second magnet are facing opposite directions and the second magnet is configured to move along the axis. The gradient magnetic field can then be a gradient of the second order or higher.

In at least one aspect, the subject technology relates to a method of determining a gradient magnetic field. A first non-magnetic element is driven at a first resonance frequency along an axis. A magnet attached to a second non-magnetic element is driven at a second resonance frequency along the axis, the first non-magnetic element and the second non-magnetic element coupled by a force along the axis, in resonance. The first non-magnetic element and the second non-magnetic element are positioned such that they are coupled by a force, along the axis, in resonance. The gradient magnetic field acting on one or more of the first non-magnetic element and magnet is determined based on change in at least one resonance characteristic.

In some embodiments, the first non-magnetic element is a sphere, the second non-magnetic element is a plate, and the plate has an attractive force to the sphere. In some cases, the first non-magnetic element is coupled to a transducer platform and the second non-magnetic element and the plate are coupled to a second force transducer platform. In some embodiments, the second resonance frequency is twice the first resonance frequency. In some cases, the force can be a Casimir force or an electrostatic force. In some embodiments, the at least one resonance characteristic is a change in frequency, a change in amplitude, or a change in phase.

In some embodiments, the magnet is a first magnet, and the method includes positioning a second magnet such that a pair of like magnetic poles of the first magnet and the second magnet are facing opposite directions. The second magnet is then configured to move along the axis, and the gradient magnetic field is a gradient of the second order or higher.

In at least one aspect, the subject technology relates to a gradiometer with a first non-magnetic element driven at a first frequency along an axis. A magnet is attached to a second non-magnetic element and driven at a second frequency along the axis. The first non-magnetic element and the second non-magnetic element are coupled by a force along the axis. The gradiometer is configured to determine a gradient magnetic field acting on one or more of the first non-magnetic element and magnet based on change in at least one characteristic.

BRIEF DESCRIPTION OF THE DRAWINGS

So that those having ordinary skill in the art to which the disclosed system pertains will more readily understand how to make and use the same, reference may be had to the following drawings.

FIG. 2b is a schematic diagram of the functional arrangement of the system of FIG. 2a.

FIGS. 5a, 5b, 5c, 6a, 6b, and 6c are graphs showing characteristics of a sphere within a system in accordance with the subject technology.

FIGS. 14a, 14b, 14c, and 14d are schematic diagrams of configurations for magnetometers and gradiometers which can be used as part of a system in accordance with the subject technology.

DETAILED DESCRIPTION

Figure 1:
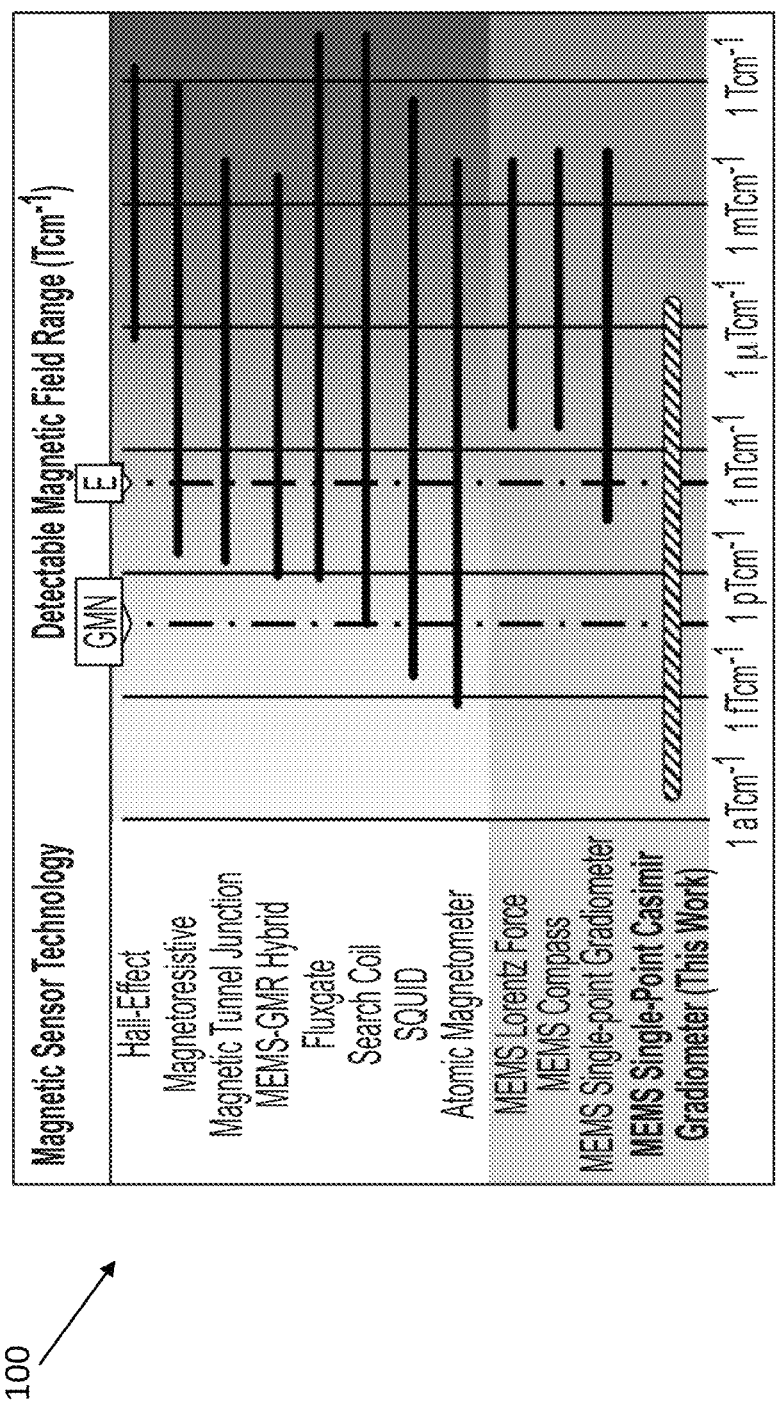
FIG. 1 is a graph showing an overview of sensitivities of gradiometer technology.

The subject technology overcomes many of the prior art problems associated with sensing platforms. Magnetometers and magnetic gradiometers are used in a vast array of applications ranging from position and rotation sensing in mechanical engineering to magnetocardiography and magnetoencephology in human health care. In brief summary, disclosed herein is a gradiometer which utilizes a coupling between two resonators by the quantum-derived Casimir Force. Fundamentally, two metrology platforms are combined- a MEMS Casimir platform and a MEMS single-point gradiometer platform. The Casimir platform comprises a MEMS accelerometer functionalized by a gold sphere, where the voltage potential can be controlled. A Casimir Force measurement is achieved when a gold plate is brought within 100 nm of the sphere. The MEMS gradiometer platform comprises a MEMS accelerometer functionalized by a cube micromagnet. Measurement is achieved by detecting an oscillating force on the permanent magnet, at resonance, where the force is proportional to a gradient magnetic field. Both resonators can also be driven in analog electrostatically. In essence, these two systems on the same central axis and within 100 nm separation form a Casimir-coupled resonator. Similar to the Casimir oscillator using a torsional plate, this design would be highly sensitive to small changes in the DC separation, due to the Casimir coupling. Therefore, DC forces from gradient magnetic fields will be intensely amplified by the coupling. Then, instead of using parametric amplification to further amplify the sensitivity, we design a technique to achieve a steady state Casimir oscillator, resilient to pull-in. Disclosed herein is a highly tunable Casimir-driven Gradiometer, sensitive to slowly varying magnetic fields and resilient to pull-in.

The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words denoting orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e. where an "upper" part must always at a higher elevation).

The subject disclosure includes a nontrivial combination of a MEMS gradiometer platform, an experimental MEMS Casimir force metrology platform, and a coupling method to parametrically modulate the interaction between the two platforms. In order to approach the divergent gain of this physical design, a tunable platform with precise positional control of the two micro objects (magnet and sphere) can be used. When the separation is reduced to near 100 nm, the Casimir force contribution becomes significant, as has been shown previously. If the separation decreases much past this, the system may experience Casimir pull-in, an event that is caused by the attractive Casimir force overcoming the restoring force of the spring, and causing the device to malfunction.

Figure 2A:
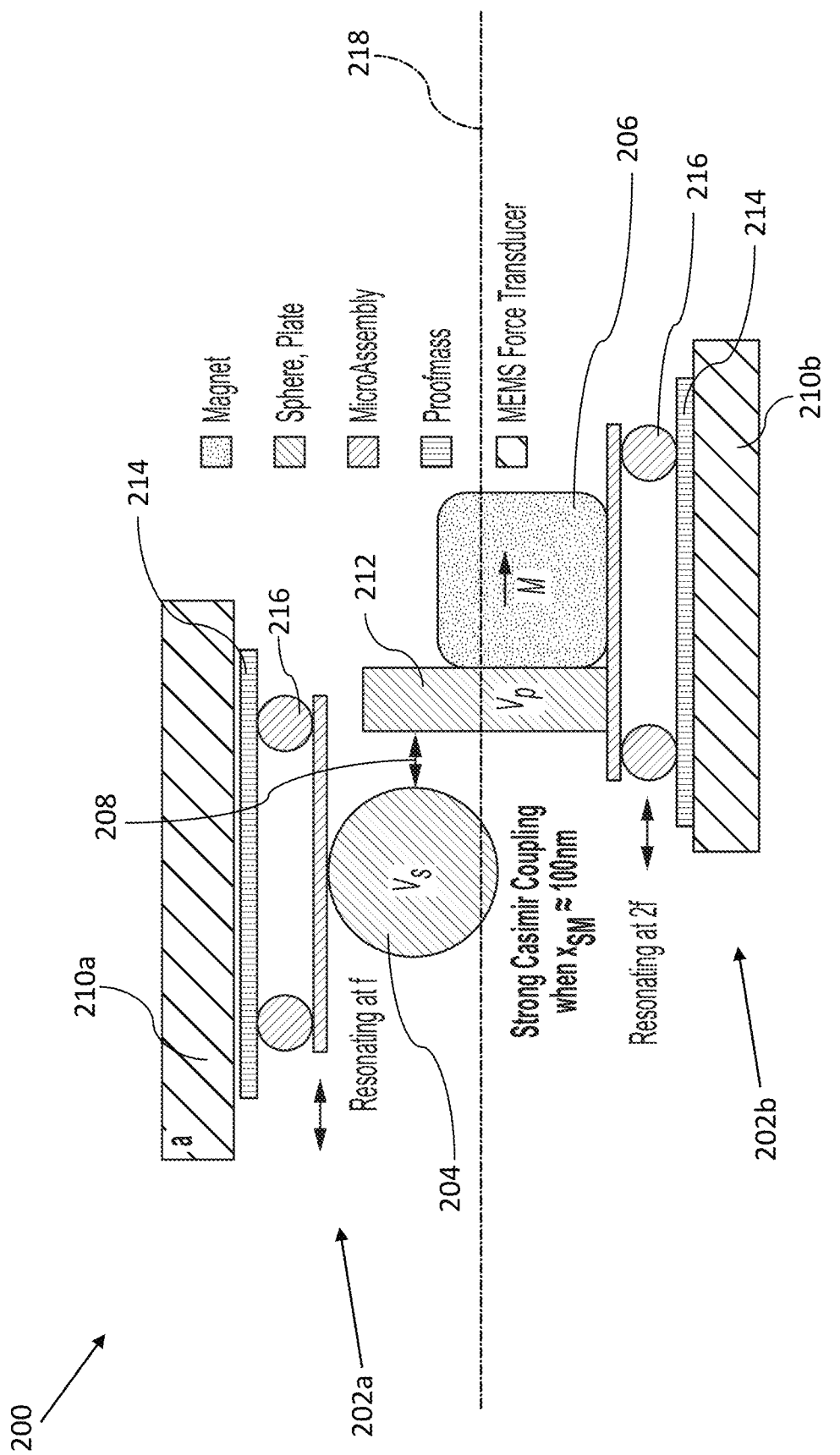
FIG. 2a is schematic diagram of a sensing system configured in accordance with the subject technology.

Referring now to FIG. 2a, a sensing system 200 designed in accordance with the subject technology is shown. The sensing system 200 acts as a gradiometer and includes a Casimir Force metrology platform 202a coupled to a MEMS gradiometer platform 202b. The sensing system 200 includes a sphere 204 (or microsphere) positioned in close proximity to a magnet 206 (or micromagnet), where the resonant modes are coupled by the quantum-derived Casimir Force. The magnet 206 is attached to a gold plate 212, the magnet 206 and plate 212 moving together. Both sphere 204 and magnet 206 are driven at resonance, where the magnet 206 is driven at two times the frequency of the sphere 204, to accomplish parametric modulation. Force from a weak gradient magnetic field will induce a small deflection of the magnet 204, decreasing the separation 208 ($x_{SM}$), and inducing a frequency and amplitude shift in the sphere oscillation, via the Casimir coupling. In order to successfully couple these two systems 202a, 202b, a highly tunable design is necessary. By assembling the sphere 204 and magnet 206 on independent MEMS force transducer platforms 210a, 210b, as shown in platform 200, their independent actuation is completely controlled. By inverting the sphere platform 202a, a separation distance 208 between the sphere 204 and plate 212 of near 100 nm can be achieved. As shown in FIG. 2a, each platform includes a proof mass 214 for testing, and an independent micro assembly 216 to allow for independent movement of the respective systems 202a, 202b along a central axis 218. In other words, the sphere 204 can move independently of the magnet 206 and plate 212 combination along the central axis 218.

Components of the system 200 can be fabricated individually using commercially available MEMS accelerometers. This is accomplished using precise control of a vacuum pick-and-place system, and feedback from a live sensor (post-release MEMS). The micromagnet used in the gradiometer design is functionalized by the gold plate 212, positioned elongated vertically such that it's planar face is directed towards the sphere 204. The platform 202*a* with the sphere 204 is inverted such that the sphere 204 has a clear pathway to come into close proximity to the plate 212. Both platforms 202*a*, 202*b* enable control of static position, oscillation amplitude, frequency, phase, and detection. The drive parameters are controlled via a built-in electrostatic self-test feature on the ADXL 203 platform, which can be used for analog control of the microobjects via pulsed width modulation (PWM)[30]. This feature is also used to calibrate for and negate the effect of an anticipated electrostatic coupling between the plate 212 and sphere 204. Notably, while a sphere and plate are used herein by way over example, it should be understood that other non-magnetic elements may also be used, including other non-magnetic elements in different orientations. However, a non-magnetic plate 206 with its elongated planar surface facing a non-magnetic sphere 204 have been found to be an advantageous arrangement. In this case, we measure a gradient in only direction (i.e. along the axis 218). However, it should be understood that in other cases, measurements could be taken of a gradient of a 3D magnetic field, including measurements in x, y, and z axes.

Figure 2B:
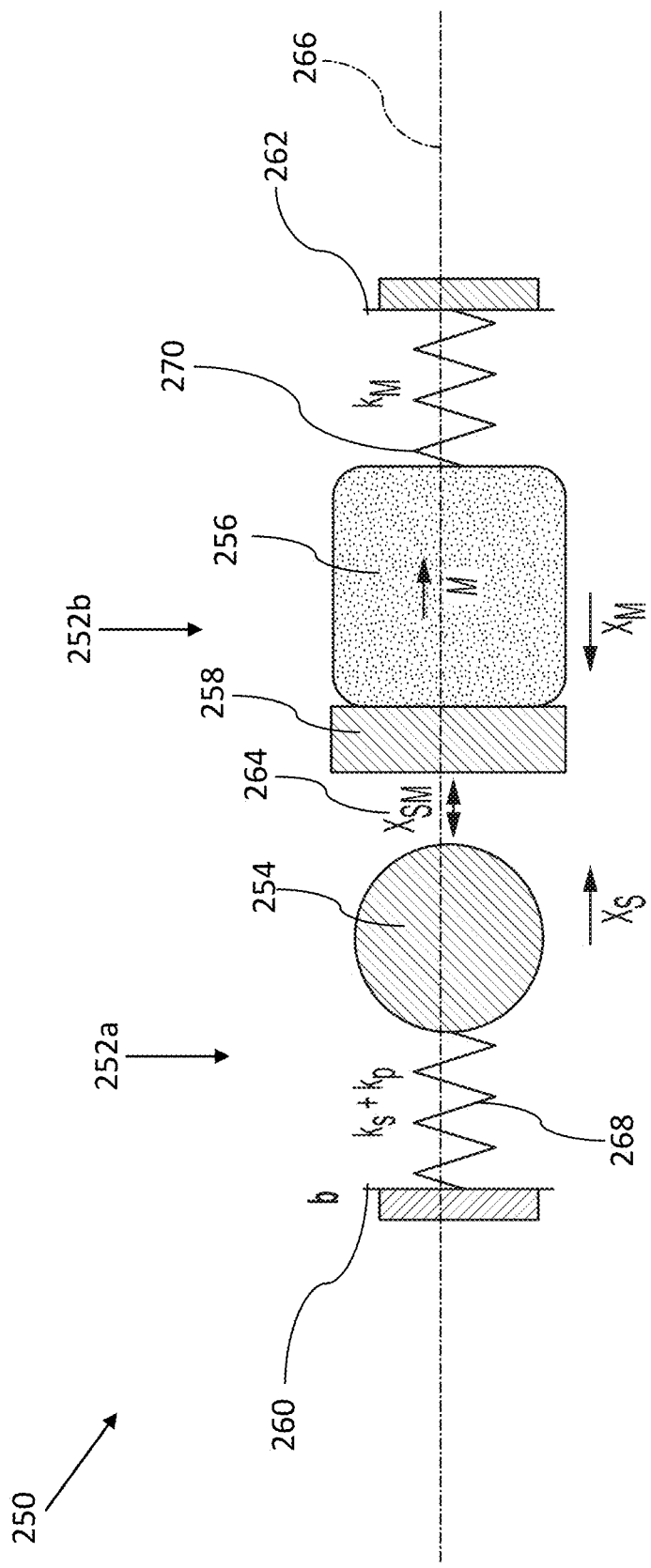

Referring now to FIG. 2B, a schematic diagraming the functional arrangement of the system 200 is shown at 250. The design for the system 200 and the accompanying parameters are chosen based on existing platforms. The functional diagram 250 is based on the interaction of two resonators. The first resonator 252*a* includes a gold microsphere 254 attached to a fixed point 260, while the second resonator 252*b* includes an assembly with a micromagnet 256 attached to a gold mirror 258 and connected to a fixed point 262. There is a separation distance 264 (or $X_{SM}$) between the microsphere 254 and mirror 258. Independently, both resonators 252*a*, 252*b* act as damped, driven harmonic oscillators. The coupling of the two resonators 252*a*, 252*b* is based on the Casimir Force, which is dependent on their separation. Assuming that out-of-plane forces are minimal, we analyze a uniaxial system of equations (Eqs 1-3) along the central axis 266 of the magnet 254:

$$m_S \ddot{x}_S + \frac{m_S \omega_{0S}}{Q_S} \dot{x}_S + k_{0S} x_S = F_{Dr-S}(t) + F_{Cas}(x_{SM}, t) \quad (1)$$

$$m_M \ddot{x}_M + \frac{m_M \omega_{0M}}{Q_M} \dot{x}_M + k_{0M} x_M = F_{Dr-M}(t) + F_{Cas}(x_{SM}, t) + F_M(t) \quad (2)$$

$$x_{SM}(t) = s_0 + x_S(t) - x_M(t) \quad (3)$$

In the equations given above, Eq. 1 relates to the sphere 254, Eq. 2 to the magnet 256, and Eq. 3 to their separation. In Eq. 1, $x_s$ is the displacement of the sphere 254, $m_s$ is the mass, $\omega_{os}$ is the natural frequency, QS the quality factor, and $k_{os}$ the unperturbed spring constant of the spring 268. The sphere 254 is driven electrostatically by $F_{Dr-S}$ and experiences an attractive coupling force, $F_{Cas}$, when the separation 264 is small (order 100 nm). Similarly, in Eq. 2, $x_M$ is the displacement of the magnet 256, $m_M$ is the mass, $\omega_{0M}$ is the natural frequency, $Q_M$ the quality factor, and $k_{0M}$ is the spring constant of the spring 270. The magnet 254 is also driven electrostatically by a force, $F_{Dr-M}$, and experiences an equal and opposite coupling force to the sphere, $F_{Cas}$, at small separations. In addition, a slow, time-varying gradient magnetic field would impose a force, $F_M$. In Eq. 3, $x_{SM}$ is the real-time separation distance between the sphere 254 and magnet 256, and so is the separation in the absence of the Casimir coupling force. The forcing terms are expanded in Eqs. 4-7 below:

$$F_{Dr-S}(t) = k_{0S} A_S \sin(\omega_{0C}(t + \tau_{1f})) \quad (4)$$

$$F_{Dr-M}(t) = k_{0S} A_M \sin(\omega_{0C}(t + \tau_{2f})) \quad (5)$$

$$F_M = M\left(\frac{dB}{dx}\right)\cos(\theta) \quad (6)$$

$$F_{Cas} = -\frac{\pi^3 hc}{360} \frac{R}{x_{SM}^3} \quad (7)$$

In Eq. 4, As is forcing amplitude of the sphere 254, $\omega_{0C}$ is the natural frequency of the coupled system, and $\tau_{1f}$ defines the fixed starting time. Similarly, in Eq. 5, $A_M$ is the forcing amplitude of the magnet 256, and $\tau_{2f}$ is the time delay of magnet actuation. Most works involving parametric pumping use a phase delay, and we describe our rationale for a time delay system below, in conjunction with the description of FIG. 4. The magnet 254 is forced at 2 $\omega_{0C}$ for parametric amplification. Eq. 6 describes the force on the magnet 254 from a gradient magnetic field predominantly along its polarized axis, where M is the moment, B is the magnetic field intensity, and θ is the angle between them. The Casimir force for a sphere-plate geometry is displayed in Eq. 7, where ℏ is Plank's constant, c is the speed of light, R is the radius of the sphere, and $x_{SM}$ is the separation between the sphere and plate as defined above.

The nominal values for simulation inputs are shown in Table 1, where the primary tuning parameters are indicated. The magnet's mass (typically 150 jig) is not a direct input to the simulation as the magnet's dynamics are controlled by feedback (discussed later during the description of FIG. 4). Table 1 is depicted below:

TABLE 1

Parameter Inputs for Simulation of Casimir Gradiometer Design.

| Parameter | Symbol | Nominal Value |
| --- | --- | --- |
| Uncoupled Resonant Frequency | $w_{0S}$ | 1 kHz |
| Quality Factor (both resonators) | Q | 1000 |
| Sphere Spring Constant | $k_{0S}$ | 25 mN/m |
| Magnet Spring Constant | $k_{0M}$ | 25 mN/m |
| Sphere Mass | $m_s$ | 1 μg |
| Sphere Radius | R | 60 μm |
| Sphere AC Amplitude | $A_S$ | 20 nm |
| Sphere Time Delay | $\tau_{1f}$ | 1.02 ms |
| Magnet AC Amplitude | $A_M$ | 10 nm |
| Magnet Time Delay | $\tau_{2f}$ | 750 μs |
| Separation | $s_0$ | ~100 nm |

In Table 1, the values are largely chosen based on reasonable implementation to existing experimental platforms. Although not directly an input to the simulation, the typical mass, $m_M$, of the cube micromagnet in this design (with 250 μm side length) is 150 μg.

When the two resonators 252*a*, 252*b* are coupled as described in Eqs. 1-3, there is a spring softening effect analogous to the electrostatic spring softening observed in capacitive systems. The coupling may then be modulated by tuning the parameters of the magnet resonator. This will be necessary to access the most sensitive region of parameter space, while preventing Casimir pull-in. Following the analytical model outlined earlier, the equation of motion for the sphere 254 (Eq. 1) in a Casimir coupled system then becomes Eq. 8 below, where the parametric spring constant, $k_p$, is defined in Eqs. 9 and 10. For simplicity, we maintain the assumption of a linear spring model as the amplitudes of oscillation are small (<100 nm).

$$m_S \ddot{x}_S + \frac{m_S \omega_{0C}}{Q_C} \dot{x}_S + [k_{0S} + k_p(x_{SM}, t)]x_S = F_{Dr-S}(t) + F_{Cas}(x_{SM}, t) \quad (8)$$

$$k_p(s_0, t) = \frac{dF_{Cas}(x_{SM}, t)}{dx_{SM}} \quad (9)$$

$$k_p(s_0) = \frac{\pi^3 hc}{120} \frac{R}{x_{SM}^4} \quad (10)$$

Figure 3B:
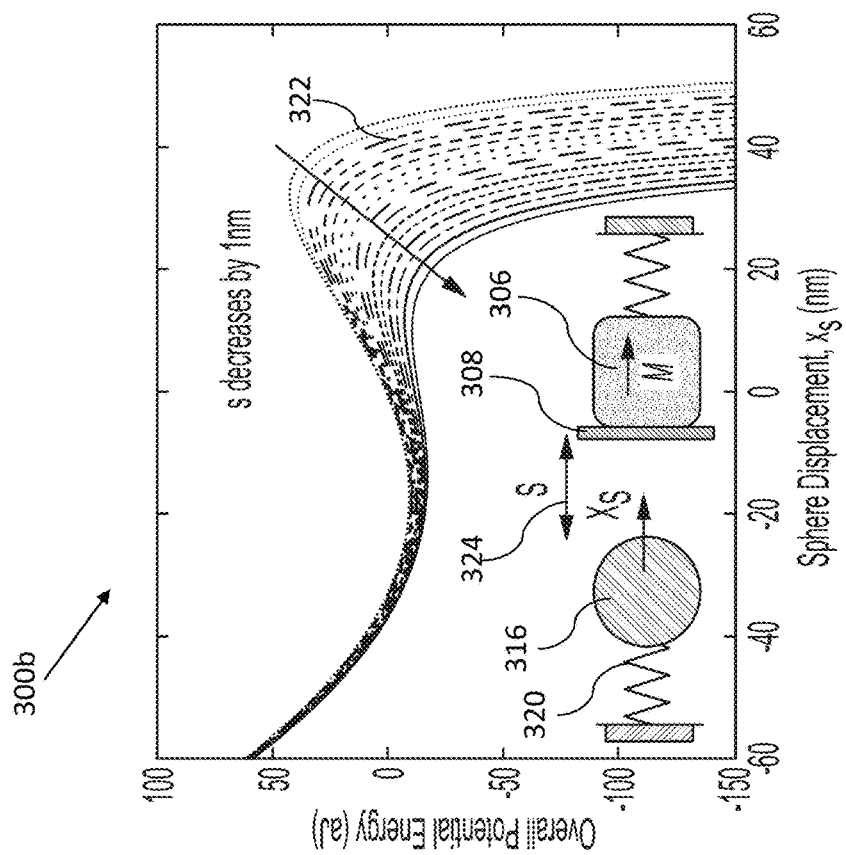
FIG. 3b is a diagram of a nonlinear Casimir oscillator with an oscillating magnet adhered to a conducting plate, in accordance with the systems described herein.
Figure 3A:
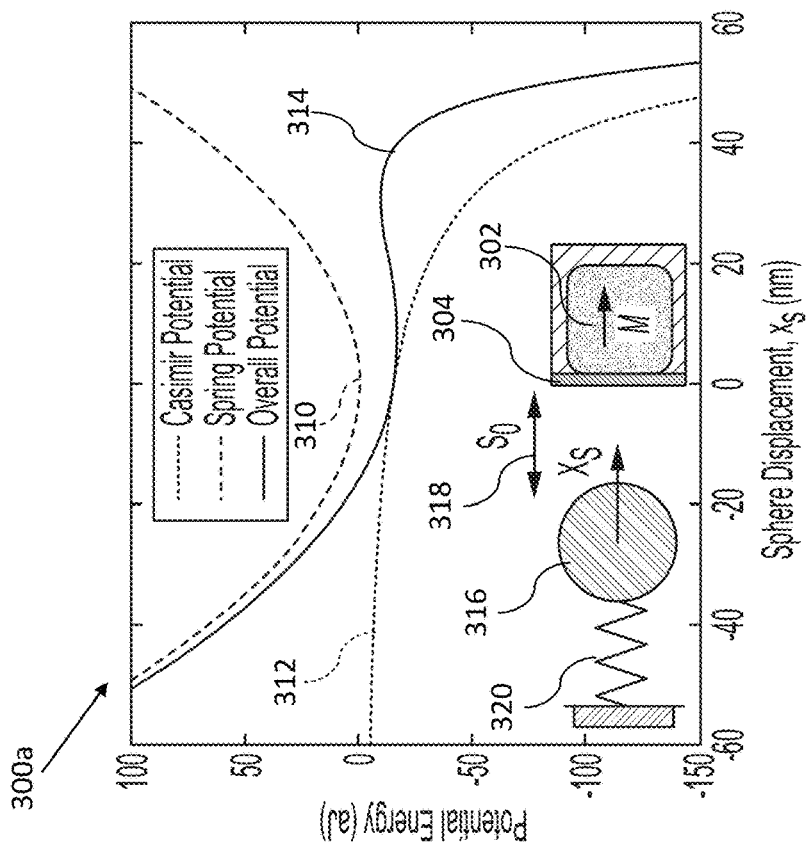
FIG. 3a is a diagram of a nonlinear Casimir oscillator with a fixed magnet, in accordance with the systems described herein.

The effect of the modulated spring constant may be best illustrated by the potential energies of a quasi-static system, as illustrated in FIGS. 3a-3b. The system 300a is a simple, nonlinear Casimir oscillator with a fixed magnet 302 and plate 304, while the system 300b uses an oscillating magnet 306 adhered to a conducting plate 308. In FIG. 3a, graph lines depict potential energy of the sphere spring without the Casimir Force (310) and related to the Casimir Force (312). The overall potential energy (314) is shown as a function of the position of the sphere 316 ($x_s$). The separation distance 318 ($s_0$) denotes the initial separation when the spring 320 is at equilibrium in absence of the Casimir Force. In FIG. 3b, graph lines 322 depict overall potential energy of sphere spring 320 with a dynamic cavity size 324 (s), modulated by movement of the magnet 316 (decreases 1 nm per curve from the top curve lines to the bottom curve lines). The cavity is highly dynamic as both the sphere 316 and magnet 306 oscillate, and $x_{SM}$ is used to represent the real-time distance between the sphere 316 and plate 308.

In the system 300a, the magnet 302 is fixed and the sphere 316, connected to a spring 320, is moved to set the gap 318 between the sphere 316 and the conducting plate 304. The gap 318 is the Casimir cavity size ($s_0$), which is defined by the equilibrium position of the spring 320 in the absence of the Casimir Force. This has been described earlier for a Casimir oscillator where $s_0$ is constant. As disclosed herein, the cavity, s, is influenced by movement of both the magnet 316 and spring 320. The overall potential energy curve is the summation of the elastic potential energy of the spring and the potential energy of the Casimir Force, as a function of the sphere 316 displacement, $x_s$, from the equilibrium position. At greater displacements, the Casimir attraction overcomes the restoring force, and pull-in occurs as the overall potential decreases rapidly. The overall potential energy curve is shown for varying Casimir cavity sizes in FIG. 3b, where each curve of graph lines 322 (from upper to lower) represents the cavity decreasing by 1 nm (this is quasistatic, so the cavity size is represented by s). The potential energy curve is changing dynamically as the sphere and magnet both move in real time (a dynamic cavity is represented by $x_{SM}$). Thus, with appropriate tuning of the magnet oscillation, one can modulate the sphere oscillation via the Casimir coupling. Furthermore, one can make the trade-off to tune the stability and sensitivity of the system as a larger amplitude pushes the sphere close to pull-in, and it turns the system more unstable but more sensitive to small perturbations on the magnet.

Figure 4:
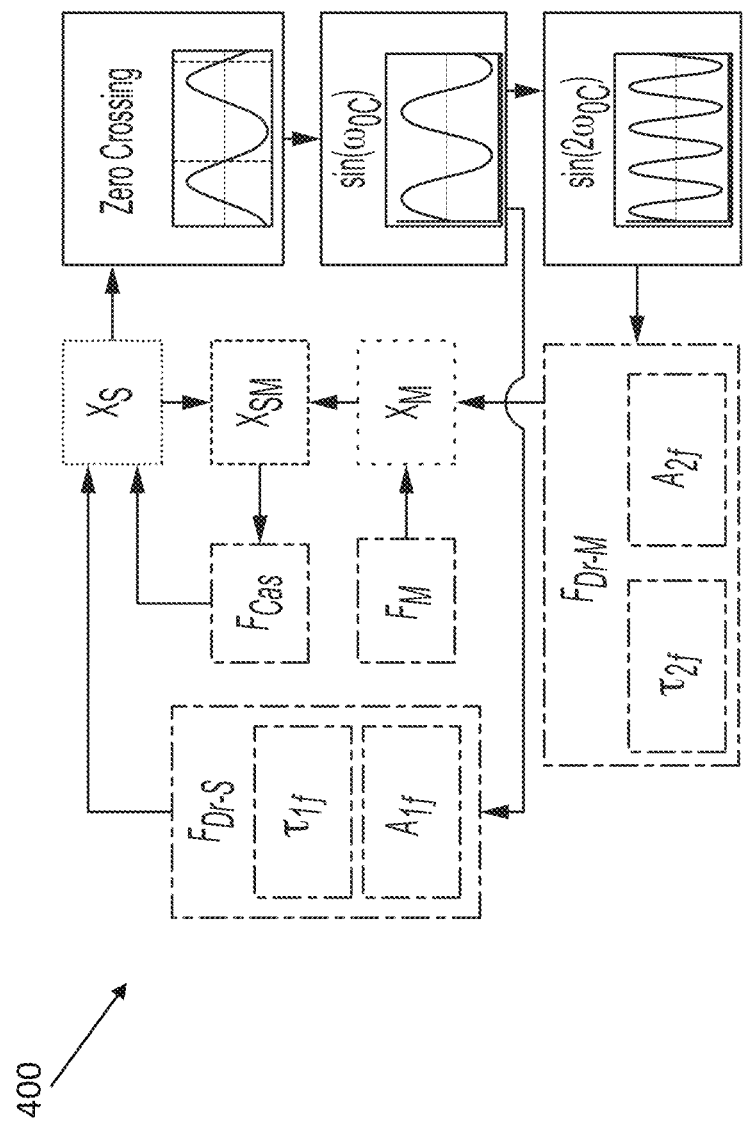
FIG. 4 is a simplified functional block diagram of a simulation of a system in accordance with the subject technology.
Figure 8:
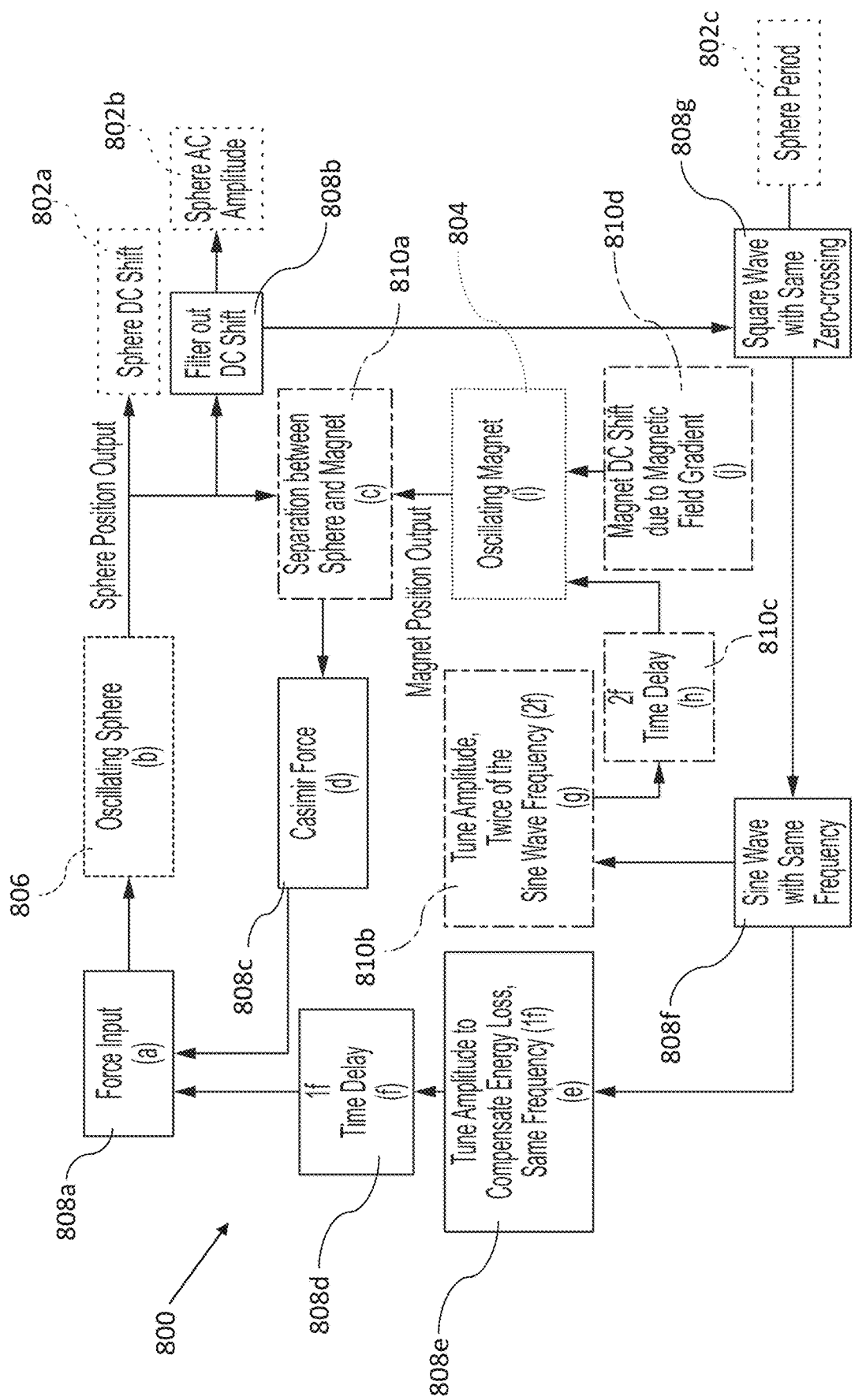
FIG. 8 is a detailed schematic of a Casimir gradiometer simulation in accordance with the subject technology.

Referring now to FIG. 4, a simplified functional block diagram of components of the system during operating is shown at 400 (a more detailed diagram is shown in FIG. 8). The system 400 described herein is a complex combination of several physical phenomena, leading to a highly nonlinear system and a large parameter space. Therefore, simulations using MATLAB's Simulink and Simscape are chosen to characterize the system 400. In essence, the nominal parameters in Table 1 are input to the system 400 and the outputs are tracked in real time. The sphere amplitude, $x_s$, is reported to gather a clear sense of the operation of the device, and the change in the coupled system resonant frequency, $\omega_{0C}$, is the ultimately proposed detection method. These values are gathered at some point in the time response after initial transients have settled (typically 0.35 s). The simulation was designed only with tools typically used in the laboratory to facilitate the translation to experimental measurement. A feedback approach is employed, where the sphere's frequency is detected by a zero crossing (negative slope). A waveform at double the frequency involving the Casimir coupling and a gradient magnetic field is fed back into the actuation of the sphere.

At the start of the simulation (t=0), we assume that the sphere (e.g. sphere 204, or other sphere disclosed herein) is resonating at the unloaded resonance frequency, $\omega_{0S}$, and the magnet (e.g. magnet 206, or other magnet disclosed herein) is resonating at $2\omega_{0S}$. The sphere and magnet are proposed to incrementally approach each other from a large separation distance (>1 µm, where the Casimir force is minimal) to reach the prescribed separation. This approach is based on the experimental observation of the Casimir Force using a similar platform. As the Casimir coupling begins to interact, the feedback system (e.g. MEMS force transducer 210a, 210b) is designed to adjust the actuation of the sphere. The resonant mode of the system is pumped such that there is little amplitude decay due to damping, a technique[31] which is well-characterized in simulation and experimentally. Previous analytical work and experimental work have controlled the phase of objects in a parametrically amplified system, but this is challenging to do in dynamic simulation experiments, such as with Simulink.

This is ultimately why a time delay approach was used, where the translation to experiment is straightforward with a precision digital delay generator (such as the DG645, SRS). It is worth noting, however, that a constant time delay will result in a changing phase delay for a system with changing oscillation frequency (as is our case). Therefore, this design is notably different from a phase delay parametric pumping system.

Figure 6A:
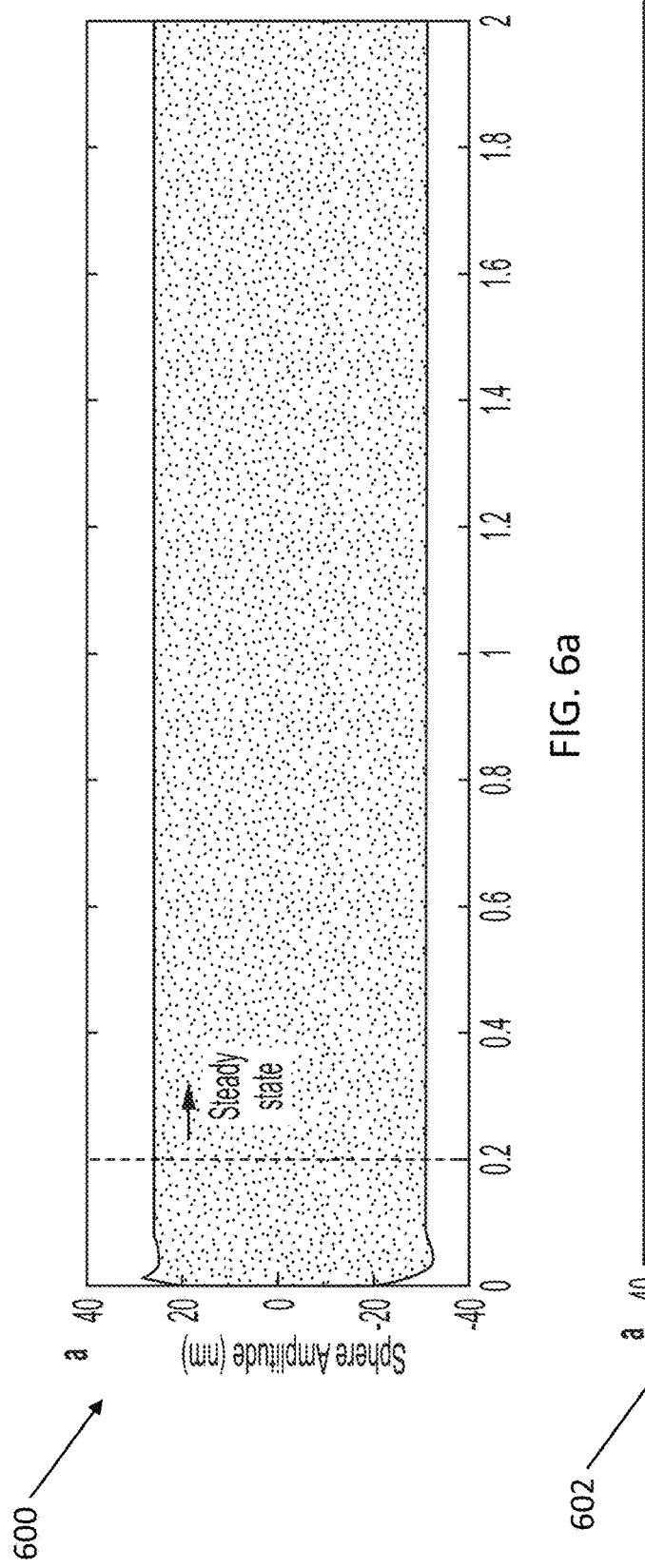

A gradient magnetic field is introduced to the system in FIG. 4 by a force, FM, on the magnet. This results in a linear deflection of the magnet by Eq. 6, changing $x_M$ and dynamically altering the separation $x_{SM}$. This force is imposed statically in FIGS. 5a-c and FIG. 7, and is imposed dynamically in FIGS. 6a-6c. The sphere amplitude is reported to intuitively convey the behavior of the device, but the resonant frequency of the coupled system is measured to infer the measurand, a gradient magnetic field. As such, we define a sensitivity, $S_{freq}$ (Hz/pT/cm), shown below in Eq 11.

$$S_{freq} = \frac{\Delta w_{0C}}{\Delta (\nabla B_x)} \quad (11)$$

Figure 7:
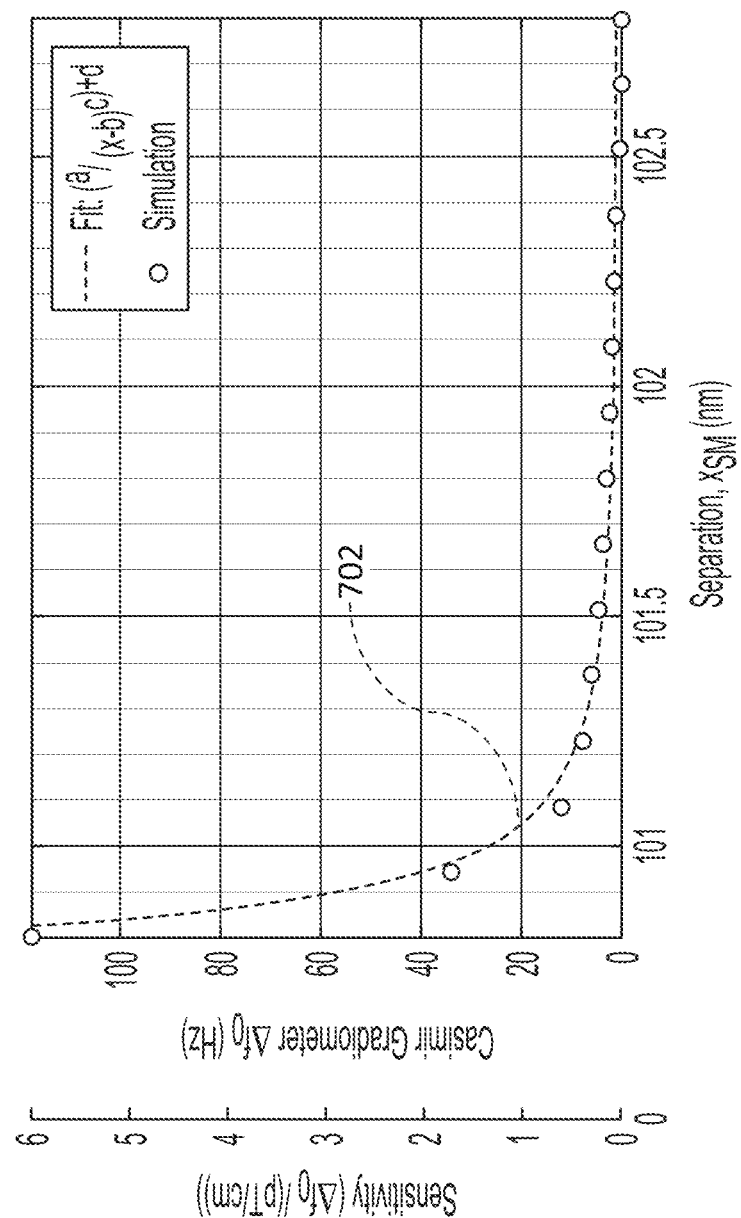
FIG. 7 is a graph showing sensitivity of a system configured in accordance with the subject technology.

In FIG. 7, this is computed by taking the slope between two consecutive data points formed by graph line 702. The parametric pumping is expected to enhance the coupling of the Casimir Force. Analytically, the sphere-plate Casimir coupling was shown to have a max gain proportional to the inverse of the 5th power of the separation when a phase delay of 0 degrees (or time delay of 0 s) is used and the sphere's amplitude is detected. To our knowledge, there is no experimental observation of a parametrically amplified Casimir coupling. Due to the anticipated danger of pull-in at maximum amplification, we identify a region of design space resilient to pull-in and with a parametrically amplified Casimir coupling. We leverage a shift in the coupled resonant frequency to propose a frequency detection scheme.

The system is characterized by simulation in FIGS. 5a-5c, where results from the dynamics of the sphere are analyzed. The uncoupled and Casimir coupled systems are illustrated using Bode plots 500 (FIG. 5a), with graph line 502 representing the uncoupled system and graph line 504 representing the coupled system. As shown in Table 1, the resonant frequency of the unloaded system is designed to be 1 kHz with a Quality factor of 1000. The Casimir coupling causes a pronounced decrease in the resonant frequency (10 s to 100 s of Hz). The high quality factor of the system facilitates frequency shift detection. Recall that the uncoupled case is when the separation between the sphere and magnet is larger than 1 μm. At such separations, the sphere responds to a harmonic drive with symmetric oscillations shepherded by the spring's linear restoring force. The coupled case is when the separation between the magnet and sphere is in the range of 100 nm. In this regime, the spring's restoring force deviates from parabolic, becoming asymmetric (see FIG. 3), leading to nonlinear dynamics.

In the coupled configuration, the parameters are tuned to characterize the system and investigate useful areas of design space. The first parameter of interest is the time delay of the magnet's oscillation, $\tau_{2f}$. In FIG. 5b, we show the temporal response to various time delays, labeled Pull-in 508 ($\tau_{2f}=0$ μs), Controlled 510 ($\tau_{2f}=750$ μs), and Deamplified 512 ($\tau_{2f}=150$ μs). This characterizes three responses for different values of $\tau_{2f}$ and the responses to finely swept values is characterized (FIG. 5c) by the AC amplitude of the sphere after transients have settled (t=0.35 s). We find a maximum amplification at $\tau_{2f}=0$ μs (corresponding to a phase delay of 0 degrees), which is consistent with previous analytical analysis of a phase delay system. While the $\tau_{2f}=0$ μs delay is the most sensitive region of the design space, we find that the two resonators in the Casimir coupled system always result in pull-in if left to interact for an arbitrarily long time. This indicates malfunction and destruction of the sensor. Consequently, we avoid this region of design space and investigate non-zero time delays for a sensitive, controlled condition. For non-zero time delays, however, this system is different than a phase delay system and may not be directly compared. We find a maximum deamplification at $\tau_{2f}=150$ μs followed by two other maxima (FIG. 5c). After the peak 514 at $\tau_{2f}=1200$ μs, the pattern repeats with slightly decreased amplitudes due to energy lost per cycle (not shown). At $\tau_{2f}=750$ μs, we report a stable, controlled oscillation of the sphere (FIG. 5b), which is expanded on in FIGS. 6a, 6b, and 7.

Figure 6B:
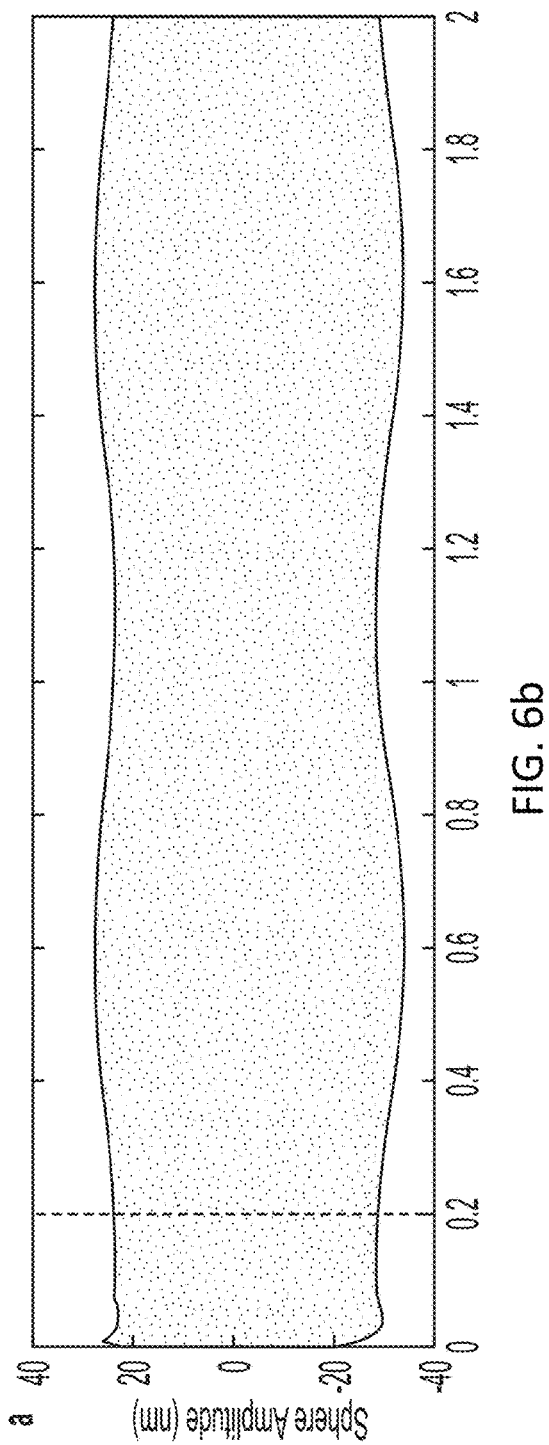
Figure 6C:
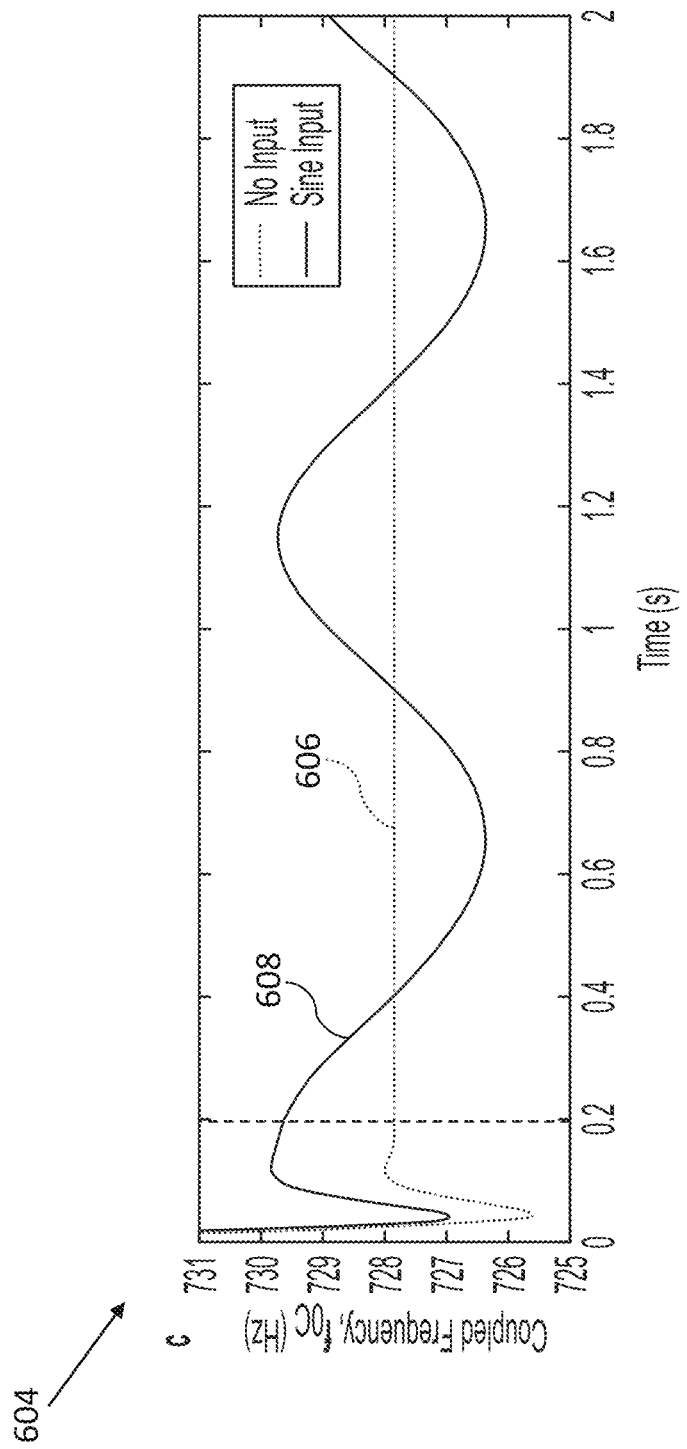

The time response of the controlled system ($\tau_{2f}=750$ μs) is dynamically characterized over an elapsed time of 2 s for zero gradient magnetic field input in graph 600 (FIG. 6a) and for a slowly varying sine wave oscillation of a gradient magnetic field in graph 602 (FIG. 6b). The resonant frequency of the coupled system in these two conditions, $f_{OC}$, is tracked in both configurations, as shown in graph 604 (FIG. 6c). The coupled system with no input field (graph line 606) reaches a steady state after approximately 200 ms, after which point the signal is stable. A dynamic gradient field input of a 1 Hz sine wave, 4 pT/cm peak-to-peak is chosen to demonstrate the response of the system to a slowly varying magnetic field (graph line 608). For a gradiometer sensitivity of 1 μN/(fT/cm), and a magnet spring constant of 25 mN/m, this gradient field would yield a 1 nm peak-to-peak oscillation of the magnet. The system responds with a 1 Hz oscillation of approximately 4 Hz peak-to-peak shift in $f_{OC}$. For very small gradients, the response will be nearly linear, and for larger gradient fields, the response will be a nonlinear, asymmetric sine wave. However, the change in the coupled resonant frequency directly maps to a change in the gradient, and so the true gradient signal can be easily calculated by ratiometric conversion.

The sensitivity, $S_{freq}$, is tunable with respect to separation (FIG. 7). System parameters of $\tau_{2f}=750$ μs and $A_{2f}=1$ nm are selected. For changing separation $x_{SM}$, the change in $f_{OC}$ is recorded. Sensitivity, on the second y-axis, is calculated using Eq. 12. The gradient field used to calculate sensitivity is the equivalent field that would deflect the magnet, altering $x_{SM}$. An inverse power function profile is observed as a result. Such a profile is expected, as the Casimir Force follows an inverse cubic function with respect to separation (Eq. 7). This design is not static, however, and the parametric pumping (Eq. 8) modifies the dynamics. As introduced earlier, analytical work with an equivalent time delay of 0 s proposed detection proportional to the $5^{th}$ power of the separation. We find the region with zero delay to lead to pull-in (FIG. 5b), and so utilize the controlled response found at $\tau_{2f}=750$ μs. To compare to the previously proposed detection scheme at maximum amplification, we use an inverse exponential fit, $y=a/(x-b)^c+d$, where a, b, c, and d are constants and c describes the power relationship. Fitting the data in FIG. 7 yields c=2.6, for the frequency detection scheme described herein. While this is significantly less sensitive than the 5th power relationship (c=5), the Casimir coupling is amplified and resilient to pull-in.

The best-case resolution of the system is discussed for frequency shift detection of the high quality peak. For laboratory based frequency detection systems, such as Agilent's 53132A frequency counter, a resolution of 10 parts-per-million using a 1 s gate time would be relatively standard. A maximum sensitivity, $S_{freq}$, of 6 Hz/(pT/cm) is observed (FIG. 7). Therefore, a frequency detection scheme would have a best-case resolution of 1.6 aT/cm at 1 Hz. While we anticipate thermo-mechanical noise to experimentally limit the technique at a much larger gradient magnetic fields, this would constitute 4 orders of magnitude improved resolution (10,000 fold) for the best-case scenario of the presently designed MEMS single-point gradiometer.

Referring now to FIG. 8, a more detailed functional block diagram of operation of a Casimir Gradiometer in accordance with the subject technology is shown generally at 800. Two resonators are set to dynamically interact, parametrically modulated by the Casimir Force. The output is represented by blocks 802a-802c. The magnet is represented by block 804, the sphere is represented by block 806, and the conditioning is presented by blocks 808a-808f, 810a-810d.

In our simulation, block 806 is the oscillating sphere with 1 kHz nature frequency and a quality factor of 1000. A low pass filter is used to optionally monitor the DC shift in the sphere position. The AC sphere position is also conditioned by a high pass filter (10 Hz cut-off) to measure the AC amplitude. The zero-crossing of this filtered signal (negative slope) is detected, cast to a Boolean variable, and processed by a JK flip-flop block to generate a square wave in phase with the sphere oscillation. The square wave amplitude is 1 and the period is recorded. The square wave, in turn, is used to generate sine wave at f and at 2f. These signals propagate through the if time delay block 808d and 2f time delay block 810c, respectively. This method is chosen as it can respond dynamically to an arbitrary waveform. Simulink has a variable phase shift block, but it cannot be tuned during simulation to a changing input. The amplitude and phase of the if signal is conditioned 808e such that the sphere's amplitude does not decay due to damping, a method which has been described and experimentally implemented earlier. The 2f signal, which has twice the frequency of the sphere, imposes a force on the magnet with tunable amplitude and delay 810b. A second force 810d, from a gradient magnetic field, is optionally applied. This force can produce a static shift, or can be a dynamic signal, as is discussed in the text. The summation of sphere position, magnet position, and tunable initial separation 810a is the real-time separation. The actual separation is used to calculate the contribution from the Casimir Force 808c on the sphere. The tuned if signal and Casimir force sum to generate the force input 808a and feed back to the sphere system. Therefore, by adjusting different 2f amplitude, time delay, initial separation and DC shift of magnet, one can comprehend how the sphere AC amplitude, DC shift and period (or frequency) evolve with time for parameter values in the simulation setting.

In some implementations, to run a simulation of the system, one can first phase lock the system at its resonant frequency, F. The simulation can create a clean sine wave at F and this signal is phase shifted by the time delay block associated with block J and then fed back into the drive input. With the signal phase locked, one varies the time delay and obtains a maximum in the oscillating amplitude.

With the system phase locked at F, one can then feed the Casimir signal into the system. The parametric Casimir signal is calculated in the following way. The initial distance between the sphere and the magnet is chosen. This is the position parameter in the simulation. A typical number is ~100 nm. The time dependent, parametric Casimir force is calculated by subtracting the amplitude of oscillation and the amplitude of the 2F drive from the position. This gives an adjusted distance that is used to calculate the Casimir force that is fed back to the system.

Figure 9:
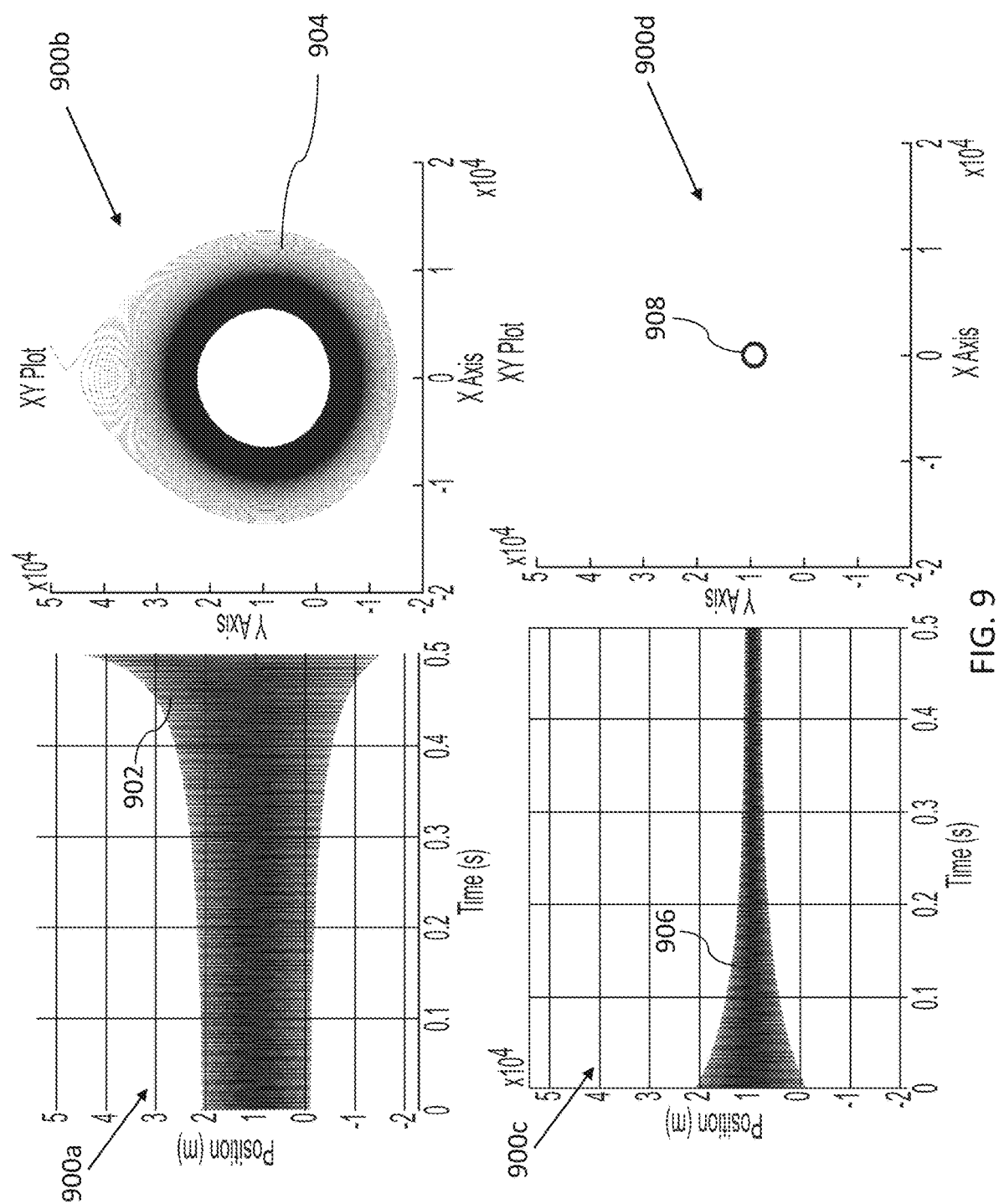
FIGS. 9a, 9b, 9c, 9d are graphs of oscillation over time for a system configured in accordance with the subject technology.

Referring now to FIG. 9, the response of the system for two different phases of the 2F drive. The upper plots 900a, 900b show the system with parametric amplification while the lower plots show. The left most graphs 900a, 900c show the position of the system as a function of time and the right most graphs 900b, 900d show the phase plots, position vs velocity with time an implicit, not explicit, plot parameter. As shown in FIG. 9, the response of the system depends on the phase of the 2F signal. In the simulation tool, the amplitude of the 2F drive can be specified, e.g. 0.2 nm, as can its phase. In graph 900a, the response of the system for a phase shift of zero is shown (graph line 902). The parametric signal rings up the amplitude over the time scale of the simulation. As expected, one see both the DC offset (~10 nm) and an AC amplitude that starts at about 11 nm and grows to ~35 nm because of the parametric pumping. Graph 900b shows a phase plot (graph line 904) where velocity is plotted on the X-axis and amplitude on the Y-axis. As the amplitude rings up it becomes asymmetric with the positive amplitude being larger than the negative going amplitude. Graph 900c shows what happens for a different phase of the 2F signal. In this case the amplitude rings down to a small, symmetric response but still offset from zero (graph line 906). The phase plot (graph line 908) shows a response where instead of expanding outward as a function of time, it spirals inward.

Figure 10A:
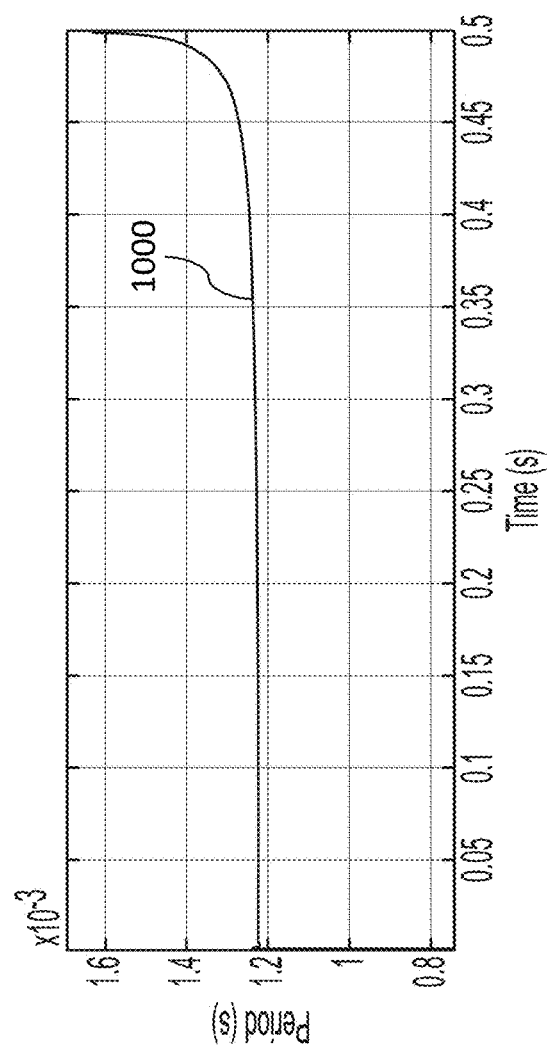
FIGS. 10a, 10b are graphs of oscillation period over time for a system configured in accordance with the subject technology.
Figure 10B:
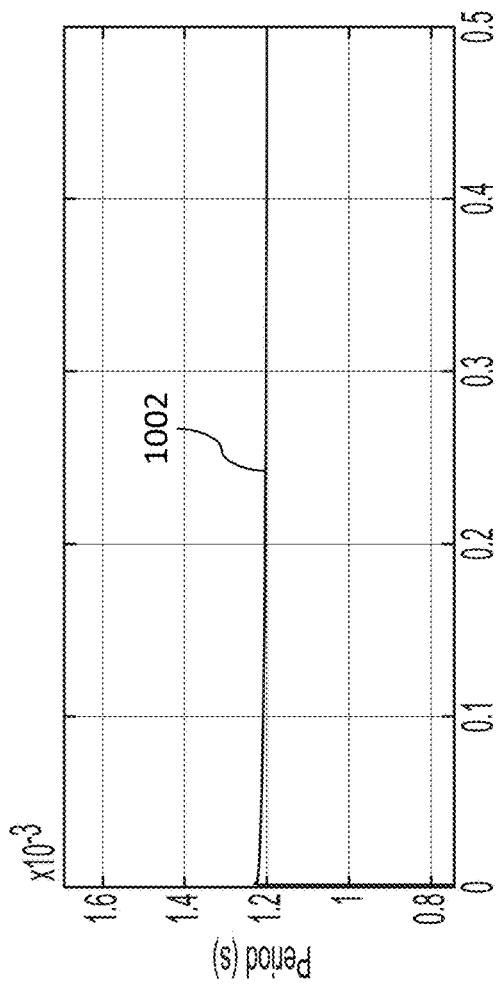

Referring now to FIGS. 10a-10b, in FIG. 10a, graph line 1000 shows how the period of oscillation evolves over time for the data shown in graph 900a. In FIG. 10b, graph line 1002 shows how it evolves for the data shown in graph 900c. For the data shown in graph 900a, as the amplitude rings up the effective restoring force on the system is reduced, increasing the period. For the data shown in graph 900c, the period slowly decreases during early times and then stays constant as the amplitude rings down (as shown in FIG. 10b).

Figure 11:
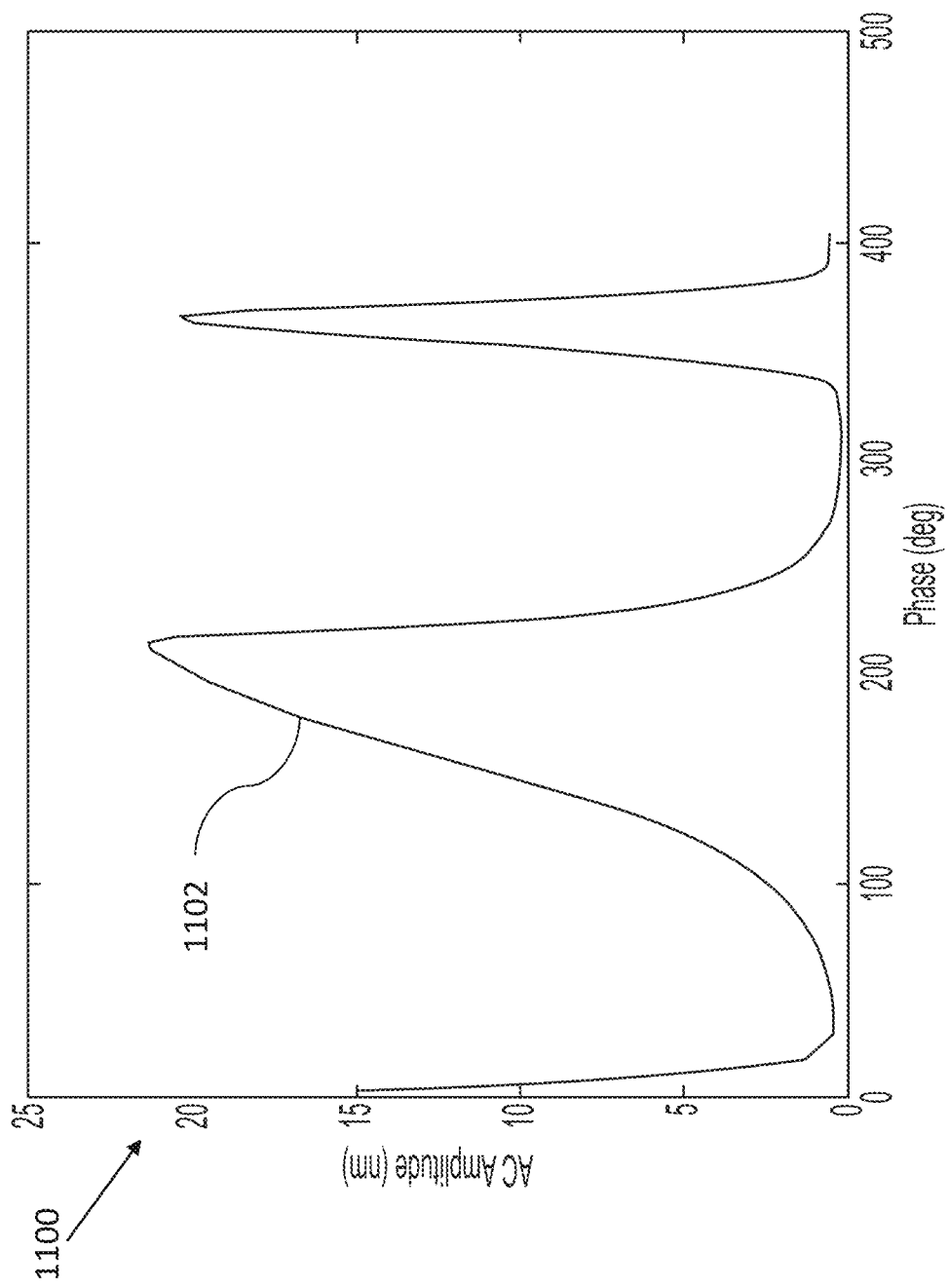
FIG. 11 is a graph of AC amplitude as a function of phase for a parametric system in accordance with the subject technology.
Figure 12:
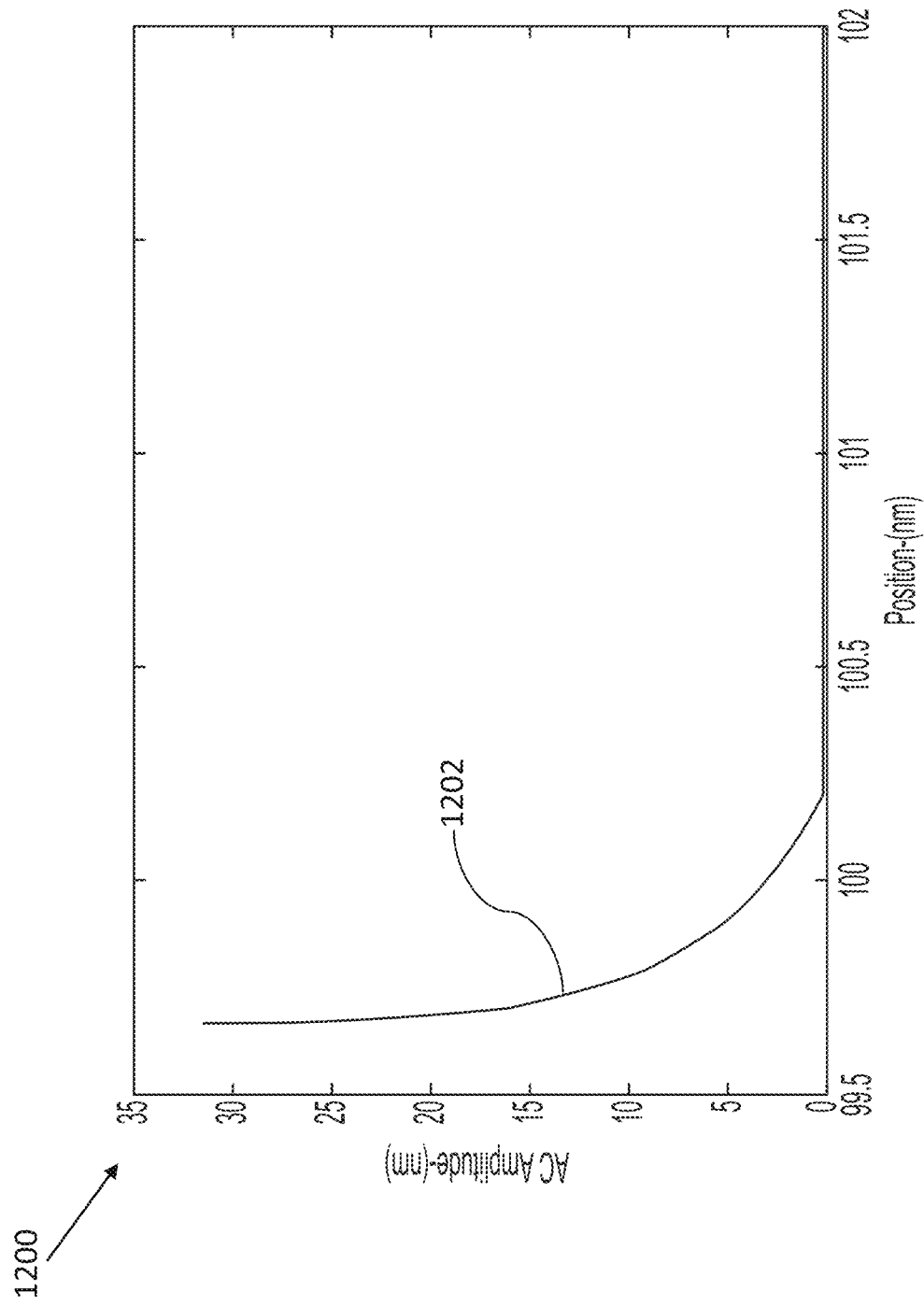
FIG. 12 is a graph of AC amplitude as a function of magnet position for a parametric system in accordance with the subject technology.
Figure 13:
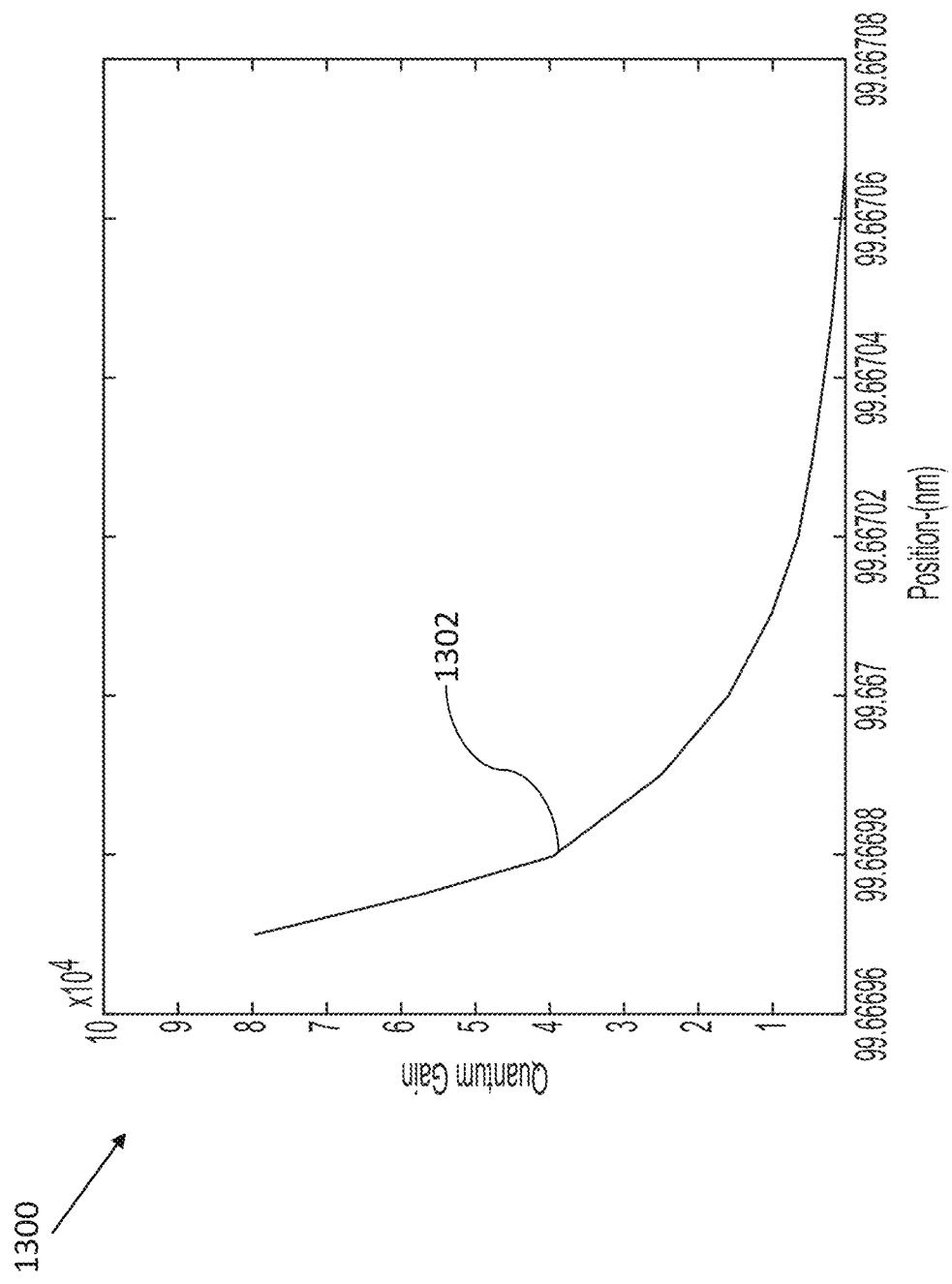
FIG. 13 is a graph of quantum gain extracted from FIG. 12.

Referring now to FIG. 11, a graph 1100 shows the amplitude of oscillation as a function of the 2F phase, as given by graph line 1102. Qualitatively one sees a typical parametric response with both amplification and de-amplification as a function of phase. By sitting at particular places on the phase response curve, one can determine the quantum gain. The quantum gain comes from the response of the system where small changes in DC position due to the static force on the magnet can cause larges changes in the AC amplitude. Graph 1100 represents such a plot. Plotted is the AC amplitude as a function of magnet position. One sees that at approximately 99.7 nm the AC response diverges. This means small changes in DC position get transferred into large AC amplitudes. This is the quantum gain of the system. The data shown in FIG. 12 can be analyzed to directly extract this gain. The graph 1200 of FIG. 12 shows the AC amplitude as a function of DC position of the magnet relative to the sphere (graph line 1202). The Casimir force depends strongly on distance and the parametric pumping amplifies the response. The graph 1300 of FIG. 13 shows the quantum gain extracted from FIG. 12, given by graph line 1302.

The analysis of the ultimate sensitivity can be obtained from the data shown in FIG. 12. A typical positional resolution of the MEMS proof mass is 1 pm. With a quantum gain of 80 k, this implies that by measuring the proof mass AC amplitude, one can detect changes in the magnet's position to a resolution of 1 pm/80 k or $1.25 \times 10^{-17}$ m. A 1 mm cube Nd52 magnet in an applied field gradient of 1 nT/cm experiences a force of 1.5 pN. Assuming the spring constant of the magnet MEMS device is similar to that of the proof mass (0.04 N/m), this implies an ultimate field sensitivity of ~300 aT/cm. This calculation assumes the first order gradiometer configuration. It should be understood that other configurations are also possible, as shown in FIGS. 14a-14d. As shown in FIGS. 10a-10b, there is a frequency shift due to the Casimir induced pumping of the mode. In the analysis above, we assume measurement of the proof mass amplitude, which can typically be done to one part in $10^4$. However, one can typically measure frequencies much better, at least to a part in $10^6$, so the resolution using frequency detection would be a few aT/cm.

Referring now to FIGS. 14a-14d, other configurations for magnetometers and gradiometers in accordance with the subject technology are shown. FIG. 14a shows a first order gradiometer, with a single magnet 1402, and is the configuration analyzed in detail herein. FIG. 14b is a second order gradiometer with two magnets 1404, 1406, with like poles positioned adjacent (and facing in opposite directions) one another. FIG. 14c is a third order gradiometer with two outer magnets 1408, 1412 oriented such that like poles are adjacent (and facing in opposite directions) to like poles of a central magnet 1410.

The configuration of FIG. 14d shows how one can use the methods described herein using a sphere 1414 and magnet 1416. A uniform magnetic field would make the magnet 1416 rotate around the axis 1418 of rotation shown in the FIG. 14d. By configuring it as a torsional system instead of a linear system, one can create parametric Casimir coupling similar to that discussed above. For use in ambient environments, the higher order gradient become less susceptible to noise. As an example, in a typical lab environment, the uniform field noise is ~50 nT, the typical gradient noise is 50 pT/cm and the typical second order gradient noise is ~50 fT/cm^2. The advantages of using higher order gradiometers for use in ambient environments is clear.

While some of this disclosure focuses on employing a Casimir-driven parametric amplifier to MEMS sensing, it should be understood that other configurations may also be used. The electrostatic force acts at larger separations (>100 nm), which may be more resilient to pull-in. Electrostatic forces may also be parametrically amplified and are also nonlinear (albeit less sensitive than the Casimir Force). Furthermore, it has been discussed that sensitivity varies with separation, and therefore with gradient magnetic field input. Although complicated for a highly dynamic system, a null-sensing technique which may enable the device to sit at a single sensitivity could be used. Using an additional feedback mechanism may be able to control the center-positions of both oscillators (keeping them constant) and may afford control of a constant, high sensitivity, such as the 6 Hz/(pT/cm) reported here.

Resonant MEMS devices such as this design are often limited by several types of noise. The characteristic 1/f noise from mechanical and electrical sources will largely not affect the resonator coupling near 1 kHz, but the low frequency changes in separation which are sought to be measured here will likely be affected. Techniques such as chopper stabilization and lock-in amplification can be employed to reduce this effect. Low frequency magnetic noise, such as from power lines in an urban area or the Earth's magnetic field will interfere with sensitive magnetic measurements. As was experimentally analyzed previously, this interference would present itself as a torque on the magnet, equal to the cross product of the magnetic moment and interference field (in plane or out-of-plane). Standard gradiometer designs reduce this noise from distant sources by subtracting the signals from two closely spaced magnetic sensors. This spacing is typically on the order of 1 cm, and so, by design, the system disclosed herein will improve this reduction with a spatial element 0.25 mm in length along the sensitive axis. Furthermore, the techniques disclosed herein presents a subtractionless measurement, offering a reduction to associated error for gradiometric measurements. The system disclosed herein can advantageously be employed in various settings. For example, the system can be used to advantage as a sensor for unshielded biomagnetic measurements. Shielding may still be employed to further reduce the interference of low frequency magnetic fields.

The system is also intended, and suitable, for use in an ambient temperature and pressure environment. Therefore, thermomechanical noise can be a dominant influence on any measurements. Thermal damping on each of the resonators is mitigated in part by the sine-wave feedback pumping. Squeeze film damping[32] has been shown to be common on MEMS devices with gaps smaller than 5 μm, such as those designed in this work. Although we intend for this design to be used in ambient environments, vacuum packaging or cryogenic environments would further reduce the effects of damping. Finally, it was theoretically shown[33] that another source of damping for a dynamic Casimir oscillator may arise from the nonuniform relative acceleration of the sphere and plate, which enclose the nonlinear properties of vacuum. In some cases, the disclosed sensing system design may be combined with cryogenic and magnetic shielding.

Overall, the system and method disclosed herein will reduce the effects of noise will profoundly enhance the performance of single-point MEMS gradiometers, as well as other gradiometers. The technology disclosed herein includes a quantum-derived coupling of two resonant microstructures to achieve extremely high sensitivity to changes in a gradient magnetic field. The resonators are coupled by the nonlinear Casimir Force, which arises from the electromagnetic interaction between closely spaced dielectrics (near 100 nm) in a sphere-plate geometry. A customized parametric amplification technique is developed, where one resonator is synchronized at double the frequency of the other, and the time delay is tuned to find a steady state solution. The frequency shift of the high quality coupled resonance peak is detected to infer a measured gradient magnetic field. A slowly varying field at 1 Hz is imposed, where a best-case resolution is calculated to be 1.6 aT/cm at a sensitivity of 6 Hz/pT/cm. This is a 10,000 fold improvement on the best-case resolution of the previously designed MEMS single-point gradiometer. Many applications, especially the measurement of biomagnetic fields, already rely on complex quantum metrology. The MEMS quantum-enhanced gradiometer presented herein paves a path toward unshielded, ambient temperature measurements of extremely weak gradient magnetic fields.

Figure 15A:
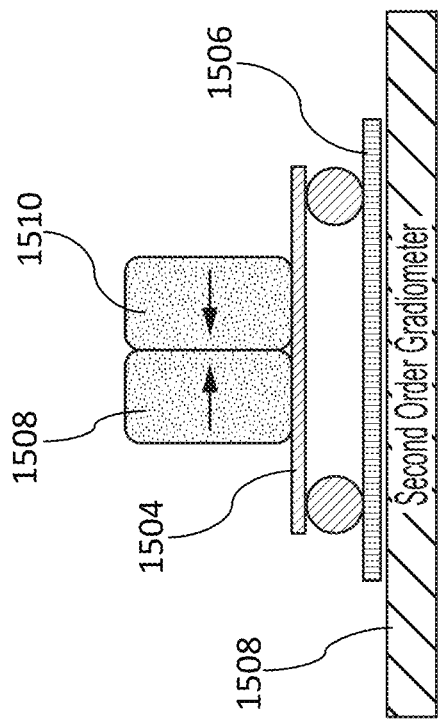
FIGS. 15a, 15b, 15c, 15d, and 15e are schematic diagrams of various systems in accordance with the subject technology.

Referring now to FIGS. 15a-e, additional designs in accordance with the subject technology are shown. The systems shown in FIGS. 15a-e can be incorporated as part of the system 200, except as otherwise shown and described herein. For example, the systems shown in FIGS. 15a-e can be incorporated into the system as part of, or instead of, the MEMS gradiometer platform 202b. The majority of magnetic sources (including biomagnetic sources) produce magnetic fields that decay with increasing distance from the source a function of $1/d^3$. These are spatial magnetic gradients. FIG. 15a represents a single magnet gradiometer 1500, as shown in FIG. 14a and discussed in detail herein. This represents a first order gradiometer 1500, which directly measures the gradient of the magnetic field and has reduced sensitivity to noise from magnetic intensity. The exemplary setup shown includes a magnet 1502, a microassembly 1504, a proof mass 1506, and a MEMS force transducer platform 1508.

Figure 15B:
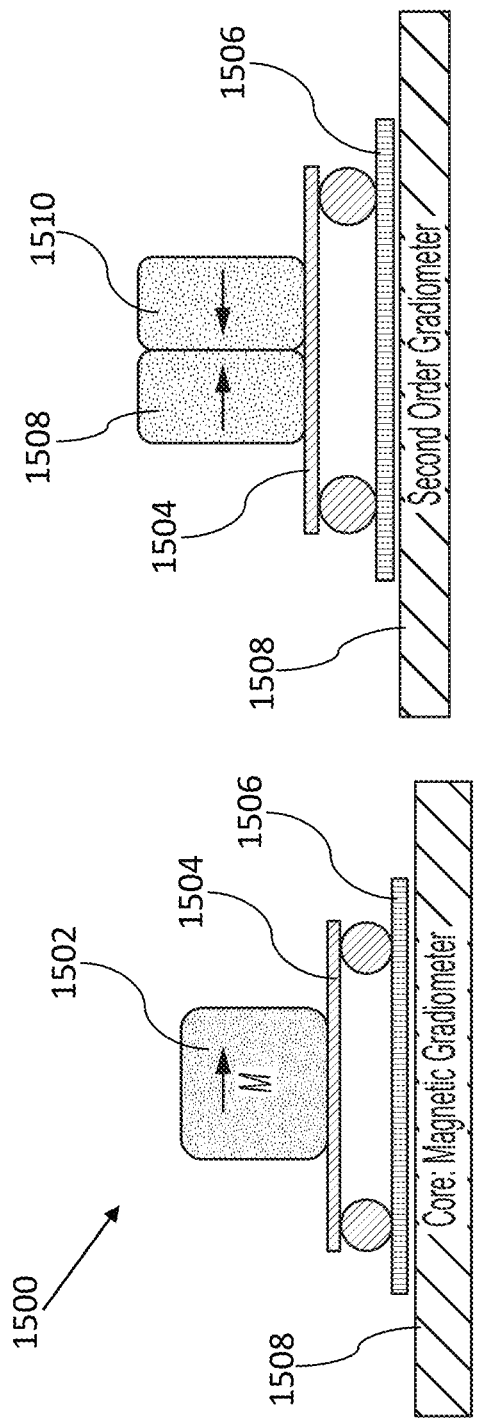

FIG. 15b represents a design for a second order gradiometer 1512 in accordance with FIG. 14b. The second order gradiometer 1512 is similar to the gradiometer 1500, except that it uses two magnets 1508, 1510 with their like poles adjacent to one another. The second order gradiometer 1512 has reduced sensitivity to both first order gradients and intensities. The immunity to such fields will significantly decrease sensitivity to magnetic interference and noise. Due to the small size of the sensing systems disclosed herein, the disclosed systems are able to get much closer to a sample, where second order gradients are at their maximum. This device will similarly feel a force on a single axis directly proportional to the magnitude of the second order gradient magnetic field. Based on these principles it should be understood that even higher order gradiometers are possible.

Figure 15C:
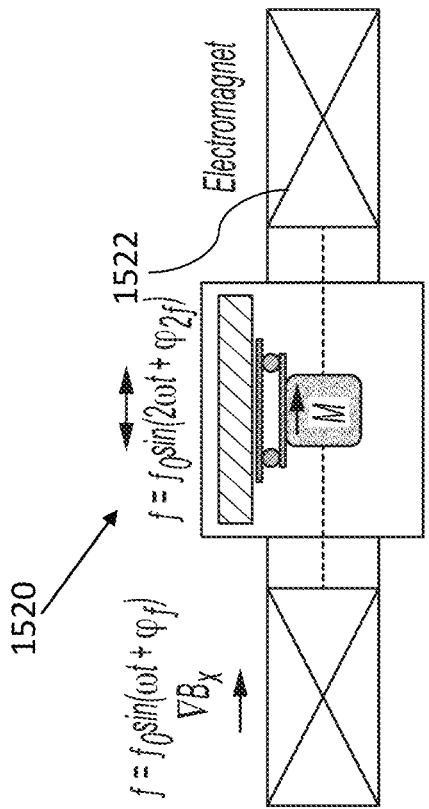

Referring now to FIG. 15c, an electromagnetically amplified gradiometer 1520 is shown. As before, systems are coupled and parametrically amplified to enhance sensitivity. The coupling mechanism is electromagnetic force from electromagnet 1522, which enables very sensitive detection (scales with ~$B^2$). The gradiometer 1520 uses similar principles as the original and requires fewer materials and avoids without parametrically amplified gain. The gradiometer 1520 does not require as much precision or control of the separation between plate and sphere.

Figures 15D, 15E:
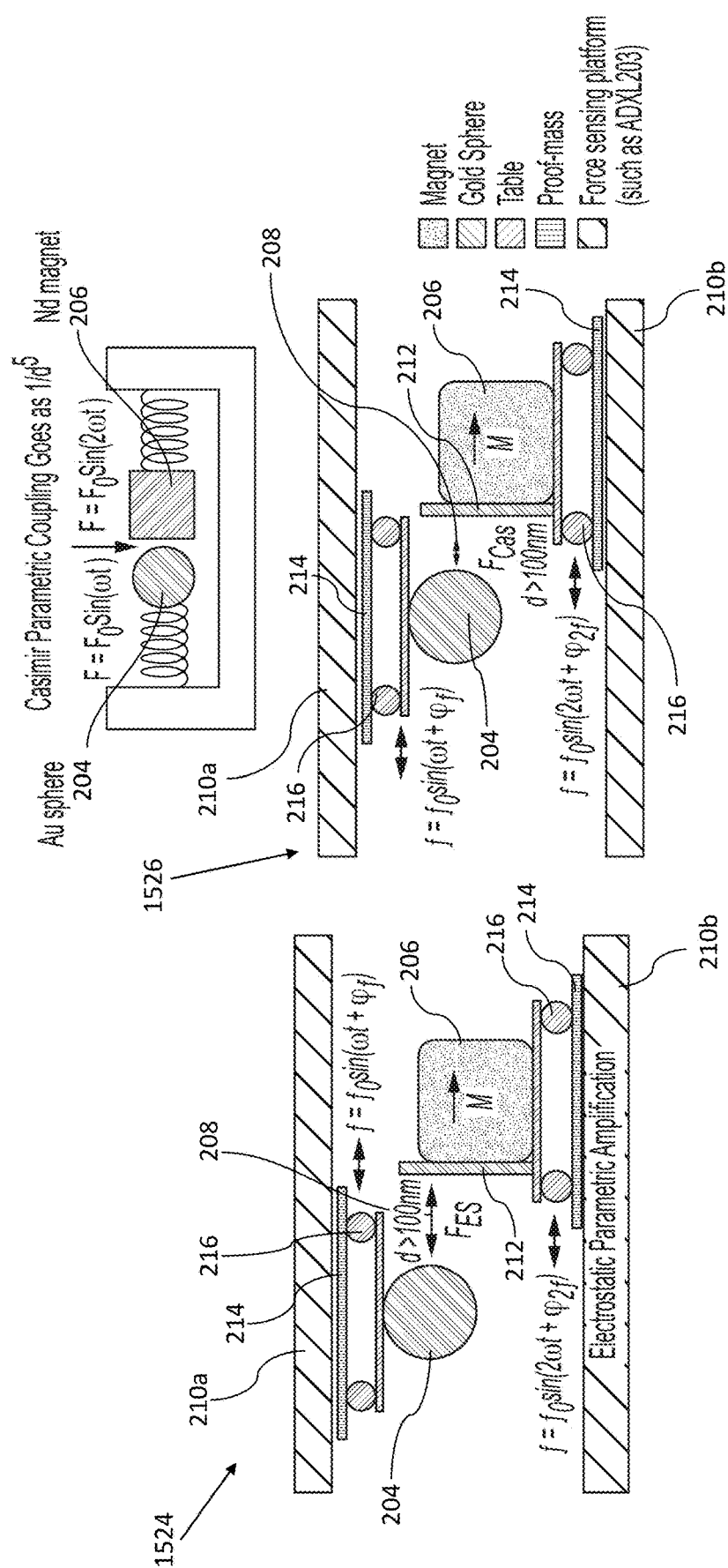

Referring now to FIG. 15d, an electrostatically amplified gradiometer 1524 is shown. The components of system 1524 are similar to those shown in the system 200, except as otherwise shown and described. As before, systems are coupled and parametrically amplified to enhance sensitivity. The coupling mechanism is now electrostatic force, which enables very sensitive detection (scales with ~$d^3$) This device uses similar principles as the original, requires the exact same materials. The gradiometer 1524 may not require as much precision or control of the separation between plate and sphere.

Referring now to FIG. 15e, an exemplary design of a quantum gradiometer 1526, in accordance with the subject technology, is shown. Systems are coupled and parametrically amplified to enhance sensitivity. The coupling mechanism is Casimir force, which enables ultra-sensitive detection (scales with $d^5$). The quantum gradiometer 1526 can function in accordance with the other teachings herein, for example, in accordance with operation of the system 200 shown in FIG. 2a.

Many of the designs described herein involve parametric amplification and detection of a gradient magnetic field via a force on a permanent magnet. The system shown and described in FIG. 2a is most sensitive, with theoretical resolutions in the atto Tesla/cm range, combining previous experimental results with an ideal integration of parametrically amplified gain. While this would be revolutionary for some applications, it may not be necessary for others. Similar systems with the same overarching ideas may broaden the application space for our new class of magnetic sensors. Another benefit of such techniques is the ability to detect low frequency fields (such as biomagnetic) with minimized 1/f noise from DC contributions, and superior detection of frequency shifts.

All orientations and arrangements of the components shown herein are used by way of example only. Further, it will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed.

Below are references which disclose background believed to be understood by those of skill in the art:

[1] Casimir, Hendrick B G. "On the attraction between two perfectly conducting plates." Proc. Kon. Ned. Akad. Wet. Vol. 51. 1948.
[2] Lifshitz, Evgenni Mikhailovich, and M. Hamermesh. "The theory of molecular attractive forces between solids." Perspectives in Theoretical Physics. Pergamon, 1992. 329-349.
[3] Dzyaloshinskii, Igor E., Efrat M. Lifshitz, and Lev P. Pitaevskii. "The general theory of van der Waals forces." Advances in Physics 10.38 (1961): 165-209.
[4] Chan, H. B., et al. "Nonlinear micromechanical Casimir oscillator." Physical Review Letters 87.21 (2001): 211801.
[5] Stange, Alexander, et al. "Building a Casimir metrology platform with a commercial MEMS sensor." Microsystems & nanoengineering 5.1 (2019): 1-9.
[6] Pérez-Morelo, Diego, et al. "A system for probing Casimir energy corrections to the condensation energy." Microsystems & Nanoengineering 6.1 (2020): 1-12.
[7] Munday, Jeremy N., Federico Capasso, and V. Adrian Parsegian. "Measured long-range repulsive Casimir-Lifshitz forces." Nature 457.7226 (2009): 170-173.
[8] Lamoreaux, Steven K. "Demonstration of the Casimir force in the 0.6 to 6 μm range." Physical Review Letters 78.1 (1997): 5.
[9] Mohideen, Umar, and Anushree Roy. "Precision measurement of the Casimir force from 0.1 to 0.9 μm." Physical Review Letters 81.21 (1998): 4549.
[10] Tang, Liang, et al. "Measurement of non-monotonic Casimir forces between silicon nanostructures." Nature Photonics 11.2 (2017): 97-101.
[11] Jourdan, Guillaume, et al. "Quantitative non-contact dynamic Casimir force measurements." EPL (Europhysics Letters) 85.3 (2009): 31001.
[12] Imboden, M., et al. "Design of a Casimir-driven parametric amplifier." Journal of Applied Physics 116.13 (2014): 134504.
[13] Maboudian, Roya, and Roger T. Howe. "Critical review: Adhesion in surface micromechanical structures." Journal of Vacuum Science & Technology B: Microelectronics and Nanometer Structures Processing, Measurement, and Phenomena 15.1 (1997): 1-20.
[14] Palasantzas, George, Mehdi Sedighi, and Vitaly B. Svetovoy. "Applications of Casimir forces: Nanoscale actuation and adhesion." Applied Physics Letters 117.12 (2020): 120501.
[15] Somers, David A T, et al. "Measurement of the Casimir torque." Nature 564.7736 (2018): 386-389.
[16] Fagaly, R. L. "Superconducting quantum interference device instruments and applications." Review of scientific instruments 77.10 (2006): 101101.
[17] Shah, Vishal, et al. "Subpicotesla atomic magnetometry with a microfabricated vapour cell." Nature Photonics 1.11 (2007): 649-652.
[18] Pannetier-Lecoeur, M., et al. "Magnetocardiography with sensors based on giant magnetoresistance." Applied Physics Letters 98.15 (2011): 153705.
[19] parimita Swain, Pragyna, et al. "A feasibility study to measure magnetocardiography (MCG) in unshielded environment using first order gradiometer." Biomedical Signal Processing and Control 55 (2020): 101664.
[20] Shah, Vishal K., and Ronald T. Wakai. "A compact, high performance atomic magnetometer for biomedical applications." Physics in Medicine & Biology 58.22 (2013): 8153.
[21] De Haro, Leyma P., et al. "Magnetic relaxometry as applied to sensitive cancer detection and localization" Biomedical Engineering/Biomedizinische Technik 60.5 (2015): 445-455.
[22] Connerney, John E P, et al. "Jupiter's magnetosphere and aurorae observed by the Juno spacecraft during its first polar orbits." Science 356.6340 (2017): 826-832.
[23] Javor, Josh, et al. "100 pT/cm single-point MEMS magnetic gradiometer from a commercial accelerometer." Microsystems & Nanoengineering 6.1 (2020): 1-13.
[24] Niekiel, Florian, et al. "Highly sensitive MEMS magnetic field sensors with integrated powder-based permanent magnets." Sensors and Actuators A: Physical 297 (2019): 111560.
[25] Herrera-May, Agustin L., et al. "Resonant magnetic field sensors based on MEMS technology." Sensors 9.10 (2009): 7785-7813.
[26] Rugar, D., and P. Grater. "Mechanical parametric amplification and thermomechanical noise squeezing." Physical Review Letters 67.6 (1991): 699.
[27] Thompson, Matthew J., and David A. Horsley. "Parametrically amplified z-axis Lorentz force magnetometer." Journal of microelectromechanical systems 20.3 (2011): 702-710.
[28] Zhou, Xin, et al. "Dynamic modulation of modal coupling in microelectromechanical gyroscopic ring resonators." Nature communications 10.1 (2019): 1-9.
[29] Zhao, Chun, et al. "A review on coupled MEMS resonators for sensing applications utilizing mode localization" Sensors and Actuators A: Physical 249 (2016): 93-111.
[30] Pollock, Corey, et al. "PWM as a low cost method for the analog control of MEMS devices." Journal of Microelectromechanical Systems 28.2 (2019): 245-253.
[31] Barrett, Lawrence, et al. "Modal Engineering for MEMS Devices: Application to Galvos and Scanners." (2020).
[32] Zhou, Wu, et al. "Air damping analysis in comb microaccelerometer." Advances in Mechanical Engineering 6 (2014): 373172.
[33] Lambrecht, Astrid, Marc-Thierry Jaekel, and Serge Reynaud. "Motion induced radiation from a vibrating cavity." Physical review letters 77.4 (1996): 615.

What is claimed is:
1. A gradiometer comprising:
   a first non-magnetic element driven at a first resonance frequency along an axis; and
   a magnet attached to a second non-magnetic element and driven at a second resonance frequency along the axis, wherein the first non-magnetic element and the second non-magnetic element are coupled by a force along the axis, in resonance, wherein the gradiometer is configured to determine a gradient magnetic field acting on one or more of the first non-magnetic element and magnet based on change in at least one resonance characteristic.

2. The gradiometer of claim 1, wherein:
the first non-magnetic element is a sphere;
the second non-magnetic element is a plate; and
the plate has an attractive force to the sphere.

3. The gradiometer of claim 1, wherein:
the first non-magnetic element is coupled to a transducer platform; and
the second non-magnetic element and the plate are coupled to a second force transducer platform.

4. The gradiometer of claim 1, wherein the second resonance frequency is twice the first resonance frequency.

5. The gradiometer of claim 1, wherein the force is a Casimir force.

6. The gradiometer of claim 1, wherein the force is an electrostatic force.

7. The gradiometer of claim 1, wherein the at least one resonance characteristic is a change in frequency.

8. The gradiometer of claim 1, wherein the at least one resonance characteristic is a change in amplitude.

9. The gradiometer of claim 1, wherein the at least one resonance characteristic is a change in phase.

10. The gradiometer of claim 1, wherein the magnet is a first magnet, and the gradiometer further comprises a second magnet, the first magnet and the second magnet being positioned such that a pair of like magnetic poles of the first magnet and the second magnet are facing opposite directions and the second magnet is configured to move along the axis, and wherein the gradient magnetic field is a gradient of the second order or higher.

11. A method of determining a gradient magnetic field, comprising:
driving a first non-magnetic element at a first resonance frequency along an axis;
driving a magnet attached to a second non-magnetic element at a second resonance frequency along the axis, the first non-magnetic element and the second non-magnetic element coupled by a force along the axis, in resonance;
positioning the first non-magnetic element and the second non-magnetic element such that they are coupled by a force, along the axis, in resonance; and
determining the gradient magnetic field acting on one or more of the first non-magnetic element and magnet based on change in at least one resonance characteristic.

12. The method of claim 11, wherein:
the first non-magnetic element is a sphere;
the second non-magnetic element is a plate; and
the plate has an attractive force to the sphere.

13. The method of claim 11, wherein:
the first non-magnetic element is coupled to a transducer platform; and
the second non-magnetic element and the plate are coupled to a second force transducer platform.

14. The method of claim 11, wherein the second resonance frequency is twice the first resonance frequency.

15. The method of claim 11, wherein the force is a Casimir force.

16. The method of claim 11, wherein the force is an electrostatic force.

17. The method of claim 11, wherein the at least one resonance characteristic is a change in frequency.

18. The method of claim 11, wherein the at least one resonance characteristic is a change in amplitude.

19. The method of claim 11, wherein the at least one resonance characteristic is a change in phase.

20. The method of claim 11, wherein the magnet is a first magnet, the method further comprising:
positioning a second magnet such that a pair of like magnetic poles of the first magnet and the second magnet are facing opposite directions, the second magnet configured to move along the axis, and wherein the gradient magnetic field is a gradient of the second order or higher.

21. A gradiometer comprising:
a first non-magnetic element driven at a first frequency along an axis; and
a magnet attached to a second non-magnetic element and driven at a second frequency along the axis, wherein the first non-magnetic element and the second non-magnetic element are coupled by a force along the axis,
wherein the gradiometer is configured to determine a gradient magnetic field acting on one or more of the first non-magnetic element and magnet based on change in at least one characteristic.

* * * * *